US012727293B2

(12) United States Patent
Kim et al.

(10) Patent No.: US 12,727,293 B2
(45) Date of Patent: Sep. 1, 2026

(54) SEMICONDUCTOR LIGHT EMITTING DIODE INCLUDING PASSIVATION LAYER HAVING DIFFERENT THICKNESSES

(71) Applicant: Samsung Display Co., LTD., Yongin-si (KR)

(72) Inventors: Tae Hun Kim, Suwon-si (KR); Geun Woo Ko, Suwon-si (KR); Ha Nul Yoo, Suwon-si (KR); Gyeong Seon Park, Suwon-si (KR); Tae Sung Jang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 620 days.

(21) Appl. No.: 18/080,464

(22) Filed: Dec. 13, 2022

(65) Prior Publication Data

US 2023/0215988 A1 Jul. 6, 2023

(30) Foreign Application Priority Data

Jan. 4, 2022 (KR) ........................ 10-2022-0001054

(51) Int. Cl.
*H10H 20/84* (2025.01)
*H01L 25/16* (2023.01)
(Continued)

(52) U.S. Cl.
CPC .......... *H10H 20/84* (2025.01); *H10H 20/819* (2025.01); *H10H 20/831* (2025.01);
(Continued)

(58) Field of Classification Search
CPC .... H10H 20/84; H10H 20/819; H10H 20/831; H10H 20/0137; H10H 20/018;
(Continued)

(56) References Cited

U.S. PATENT DOCUMENTS 9,537,049 B2 * 1/2017 Hwang ................ H10H 20/813
11,784,285 B2 10/2023 Choi et al.
(Continued)

FOREIGN PATENT DOCUMENTS

CN 107210350 A * 9/2017 ........... H01L 25/075
JP 4927223 B2 5/2012
(Continued)

OTHER PUBLICATIONS

EPO Extended European Search Report dated Jun. 2, 2023, issued in corresponding European Patent Application No. 23150101.6 (10 pages).

*Primary Examiner* — Scott B Geyer
(74) *Attorney, Agent, or Firm* — Womble Bond Dickinson (US) LLP

(57) ABSTRACT

A semiconductor light emitting device includes a first conductivity type semiconductor, an active layer on the first conductivity type semiconductor, a second conductivity type semiconductor on the active layer, an electrode layer on the second conductivity type semiconductor, and a passivation layer covering at least side surfaces of the first conductivity type semiconductor, the active layer, the second conductivity type semiconductor, and the electrode layer. The angle between the lower surface and the side surface of the electrode layer is about 45° or more and about 90° or less. The passivation layer includes a first portion disposed on a side surface of the first conductivity type semiconductor and having a first thickness, and a second portion on a side surface of the electrode layer and having a second thickness different from the first thickness.

20 Claims, 30 Drawing Sheets

(51) Int. Cl.

| | |
|---|---|
| ***H10H 20/01*** | (2025.01) |
| ***H10H 20/819*** | (2025.01) |
| ***H10H 20/825*** | (2025.01) |
| ***H10H 20/831*** | (2025.01) |

(52) U.S. Cl.
CPC ........ *H01L 25/167* (2013.01); *H10H 20/0137* (2025.01); *H10H 20/018* (2025.01); *H10H 20/034* (2025.01); *H10H 20/825* (2025.01)

(58) Field of Classification Search
CPC .. H10H 20/034; H10H 20/825; H10H 20/818; H10H 20/81; H01L 25/167
See application file for complete search history.

(56) References Cited

U.S. PATENT DOCUMENTS

| | | | | |
|---|---|---|---|---|
| 12,218,274 | B2 | 2/2025 | Lee et al. | |
| 12,490,555 | B2 | 12/2025 | Hwang et al. | |
| 2015/0349226 | A1* | 12/2015 | Shinohara | H01L 24/05 438/22 |
| 2015/0380606 | A1* | 12/2015 | Padullaparthi | H01S 5/18313 438/40 |
| 2017/0317228 | A1* | 11/2017 | Sung | H10H 20/84 |
| 2020/0395509 | A1 | 12/2020 | Nishiyama | |
| 2021/0242369 | A1 | 8/2021 | Choi et al. | |
| 2022/0037562 | A1* | 2/2022 | Moon | H01L 25/0753 |
| 2022/0045244 | A1* | 2/2022 | Yoo | H10H 20/811 |
| 2022/0085097 | A1 | 3/2022 | Song et al. | |
| 2022/0109023 | A1* | 4/2022 | Lee | H01L 25/0753 |
| 2022/0238756 | A1 | 7/2022 | Kang et al. | |
| 2022/0376144 | A1 | 11/2022 | An et al. | |
| 2022/0384682 | A1* | 12/2022 | Smith | H10H 20/831 |
| 2023/0033196 | A1* | 2/2023 | Huang | H10H 20/841 |
| 2023/0062301 | A1 | 3/2023 | Kim et al. | |
| 2023/0207740 | A1* | 6/2023 | Lee | H10H 20/831 257/91 |
| 2023/0352621 | A1* | 11/2023 | Cha | H10H 20/831 |

FOREIGN PATENT DOCUMENTS

| | | | | |
|---|---|---|---|---|
| KR | 101186684 | B1 * | 9/2012 | H10H 20/0364 |
| KR | 101288908 | B1 * | 7/2013 | H10H 20/831 |
| KR | 20170133717 | A * | 12/2017 | H01L 27/156 |
| KR | 20170133758 | A * | 12/2017 | H01L 33/387 |
| KR | 10-2020-0088934 | A | 7/2020 | |
| WO | WO-2020111417 | A1 * | 6/2020 | H10H 20/857 |
| WO | WO-2020260546 | A1 * | 12/2020 | H10H 20/818 |
| WO | WO-2021006486 | A1 * | 1/2021 | H10H 20/01 |
| WO | 2021/054551 | A1 | 3/2021 | |
| WO | 2021/246578 | A1 | 12/2021 | |
| WO | 2022/164168 | A1 | 8/2022 | |
| WO | 2023/033297 | A1 | 3/2023 | |

* cited by examiner

SEMICONDUCTOR LIGHT EMITTING DIODE INCLUDING PASSIVATION LAYER HAVING DIFFERENT THICKNESSES

CROSS-REFERENCE TO RELATED APPLICATION

This application claims the benefit under 35 USC 119(a) of Korean Patent Application No. 10-2022-0001054, filed on Jan. 4, 2022, in the Korean Intellectual Property Office, the entire disclosure of which is incorporated herein by reference for all purposes.

BACKGROUND

1. Field

Embodiments relate to a semiconductor light emitting device.

2. Description of the Related Art

Semiconductor light emitting diodes (LEDs) may be used as light sources for lighting devices as well as light sources for various electronic products. For example, LEDs may be used as light sources for various display devices, e.g., a television (TV), a mobile phone, a personal computer (PC), a notebook PC, and a personal digital assistant (PDA).

For example, a display device may include a display panel configured as a liquid crystal display (LCD) with a separate backlight or an integrated backlight. For example, the integrated backlight (i.e., a form in which a backlight is not separately required) may include an LED element as one pixel. Such a display device may be formed to be compact, and may also be implemented as a high-brightness display device having superior light efficiency.

SUMMARY

According to example embodiments, a semiconductor light emitting device includes a first conductivity type semiconductor; an active layer on the first conductivity type semiconductor; a second conductivity type semiconductor on the active layer; an electrode layer on the second conductivity type semiconductor; and a passivation layer covering at least side surfaces of the first conductivity type semiconductor, the active layer, the second conductivity type semiconductor, and the electrode layer. An angle between a lower surface and the side surface of the electrode layer is 45° or more and 90° or less. The passivation layer includes a first portion on the side surface of the first conductivity type semiconductor and having a first thickness, and a second portion on the side surface of the electrode layer and having a second thickness different from the first thickness.

According to example embodiments, a semiconductor light emitting device includes a first conductivity type semiconductor; an active layer on the first conductivity type semiconductor; a second conductivity type semiconductor on the active layer; an electrode layer on the second conductivity type semiconductor; and a passivation layer covering at least side surfaces of the first conductivity type semiconductor, the active layer, the second conductivity type semiconductor, and the electrode layer. The electrode layer overlaps the second conductivity type semiconductor in a vertical direction. The side surface of the electrode layer includes at least a portion that is not aligned with a side surface of the second conductivity type semiconductor.

According to example embodiments, a semiconductor light emitting device includes a light emitting structure including a first conductivity type semiconductor, an active layer on the first conductivity type semiconductor, and a second conductivity type semiconductor on the active layer; an electrode layer on the second conductivity type semiconductor of the light emitting structure; and a passivation layer covering at least side surfaces of the first conductivity type semiconductor, the active layer, the second conductivity type semiconductor, and the electrode layer. A perimeter of a lower surface of the electrode layer is spaced apart from a perimeter of an upper surface of the second conductivity type semiconductor by a distance of about 30 nm to about 50 nm.

BRIEF DESCRIPTION OF DRAWINGS

Features will become apparent to those of skill in the art by describing in detail exemplary embodiments with reference to the attached drawings, in which:

FIG. 3 is a partially enlarged view of portion A in FIG. 1, according to example embodiments;

FIGS. 11A to 11E are cross-sectional views of stages in a method of manufacturing a semiconductor light emitting device according to example embodiments;

FIGS. 12A to 12F are cross-sectional views of stages in a method of manufacturing a semiconductor light emitting device according to example embodiments;

FIGS. 13A to 13E are cross-sectional views of stages in a method of manufacturing a semiconductor light emitting device according to example embodiments; and FIGS. 14A to 14D are cross-sectional views of stages in a method of manufacturing a semiconductor light emitting device according to example embodiments.

DETAILED DESCRIPTION

Figure 1:
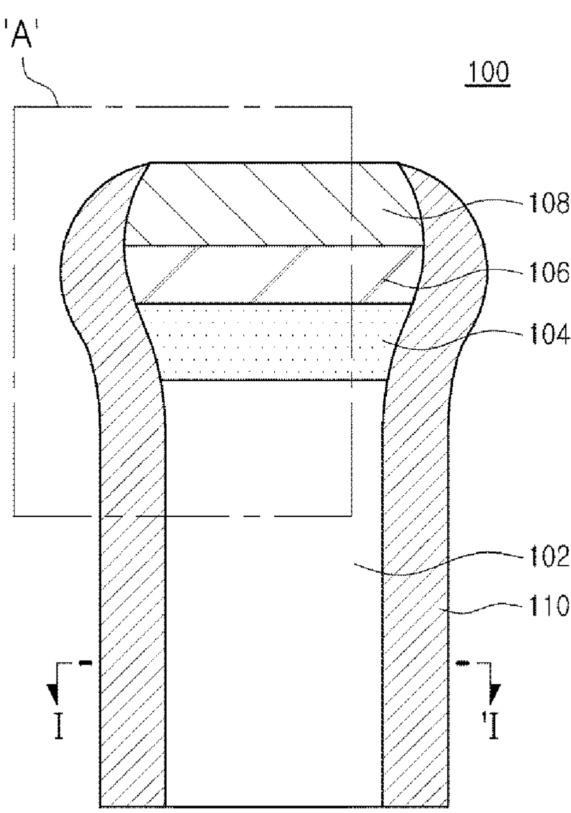
FIG. 1 is a side cross-sectional view of a semiconductor light emitting device according to example embodiments.
Figure 2A:
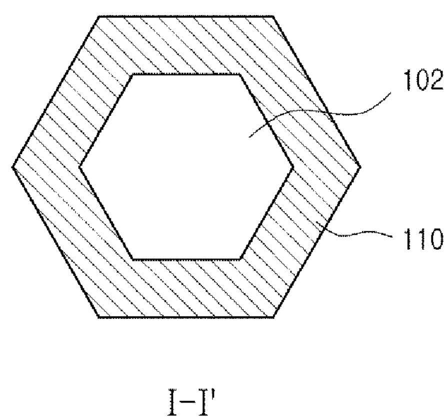
FIGS. 2A and 2B are top cross-sectional views taken along line I-I' of FIG. 1.
Figure 2B:
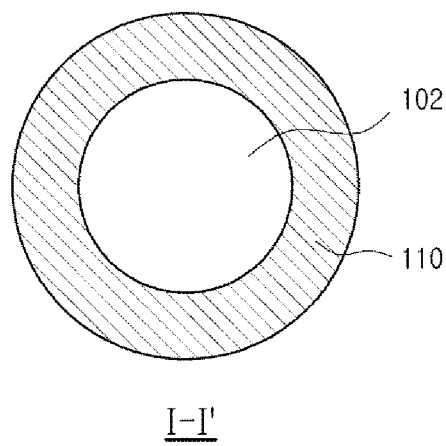
Figure 3:
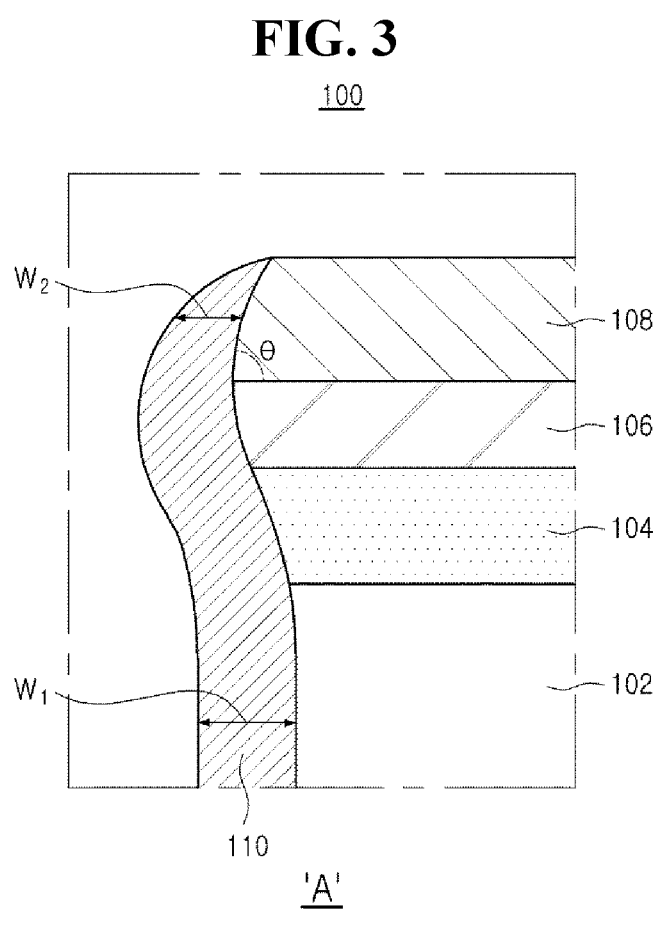

FIG. 1 is a side cross-sectional view of a semiconductor light emitting device according to example embodiments. FIGS. 2A and 2B are cross-sectional views taken along line I-I' of the semiconductor light emitting device illustrated in FIG. 1. FIG. 3 is a partially enlarged view of region 'A' of the semiconductor light emitting device illustrated in FIG. 1.

Referring to FIGS. 1 to 3, a semiconductor light emitting device 100 according to example embodiments may include a first conductivity type semiconductor 102, an active layer 104, a second conductivity type semiconductor 106, an electrode layer 108, and a passivation layer 110 covering side surfaces of the first conductivity type semiconductor 102, the active layer 104, the second conductivity type semiconductor 106, and the electrode layer 108.

The first conductivity type semiconductor 102 may include a nitride semiconductor satisfying n-type $In_xAl_yGa_{1-x-y}N$ ($0 \leq x < 1$, $0 \leq y < 1$, $0 \leq x+y < 1$), and the n-type impurity may be Si. For example, the first conductivity type semiconductor 102 may include an n-type GaN layer.

The first conductivity type semiconductor 102 may have a rod shape, e.g., the first conductivity type semiconductor 102 may have a thickness in the Z direction that is larger than its width in the X direction. For example, as illustrated in FIG. 2A, the first conductivity type semiconductor 102 may have a hexagonal pillar structure having a substantially hexagonal cross-section in a top view. In another example, as illustrated in FIG. 2B, the first conductivity type semiconductor 102 may have a cylindrical structure having a circular cross-section in a top view. In yet another example, the cross-section of the first conductivity type semiconductor 102 may have a polygonal structure or a rounded shape, e.g., a hexagonal shape without angled points.

The active layer 104 may be disposed, e.g., directly, on the first conductivity type semiconductor 102. The active layer 104 may have a multi-quantum well (MQW) structure in which quantum well layers and quantum barrier layers are alternately stacked with each other. For example, the quantum well layer and the quantum barrier layer may have different compositions of $In_xAl_yGa_{1-x-y}N$ ($0 \leq x \leq 1$, $0 \leq y \leq 1$, $0 \leq x+y \leq 1$). In an example embodiment, the quantum well layer may be $In_xGa_{1-x}N$ ($0 < x \leq 1$), and the quantum barrier layer may be GaN or AlGaN. The thickness of the quantum well layer and the quantum barrier layer may each be in the range of about 1 nm to about 50 nm. The active layer 104 is not limited to a multi-quantum well structure, and may have a single quantum well structure.

Referring to FIGS. 1 to 3, the active layer 104 may include a lower surface, an upper surface having a width greater than a width of the lower surface, and an oblique side surface connecting the lower surface and the upper surface. For example, as illustrated in FIG. 1, the lower surface and the upper surface of the active layer 104 may be spaced apart from each other along the Z direction, with the lower surface facing, e.g., being directly on, the first conductivity type semiconductor 102. For example, as illustrated in FIG. 1, the lower surface and the upper surface may have different widths in the X direction, e.g., the active layer 104 may have a trapezoidal vertical cross-section.

For example, as illustrated in FIG. 1, the lower surface may have a greater width than the upper surface in the X direction. In another example, the lower surface of the active layer 104 may have the same width as the upper surface, or the lower surface may have a smaller width than the upper surface. The active layer 104 may have a side surface connecting the lower and upper surfaces at a predetermined angle with respect to the lower and upper surfaces. For example, as illustrated in FIG. 1, the side surface may have a slope at an obtuse angle with respect to the lower surface. In another example, the side surface may have a slope at an acute angle with respect to the lower surface, i.e., opposite to that illustrated in FIG. 1, when the lower surface is wider than the upper surface. In yet another example, the side surface may be perpendicular to the upper surface and the lower surface, i.e., when the lower and upper surfaces have a same width.

The second conductivity type semiconductor 106 may be disposed on the active layer 104, e.g., the active layer 104 may be directly between the first conductivity type semiconductor 102 and the second conductivity type semiconductor 106. The second conductivity type semiconductor 106 may be a nitride semiconductor satisfying p-type $In_xAl_yGs_{1-x-y}N$ ($0 \leq x < 1$, $0 \leq y < 1$, $0 \leq x+y < 1$), and the p-type impurity may be Mg.

For example, referring to FIGS. 1 to 3, the second conductivity type semiconductor 106 may be a single-layer structure. In another example, the second conductivity type semiconductor 106 may have a multilayer structure having different compositions. For example, as further illustrated in FIG. 1, the second conductivity type semiconductor 106 may have lower and upper surfaces with different widths in the X direction, e.g., with an upper surface wider than the lower surface.

Figure 4:
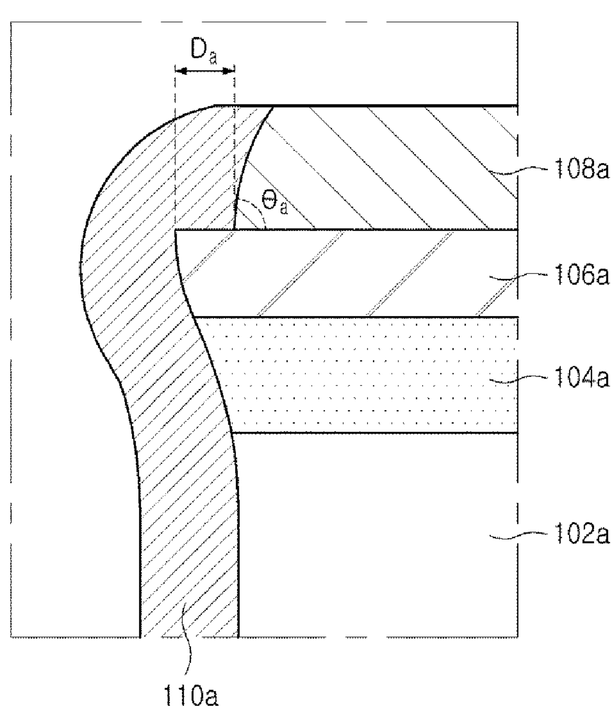
FIG. 4 is a partially enlarged view of region A in FIG. 1, according to example embodiments.
Figure 5:
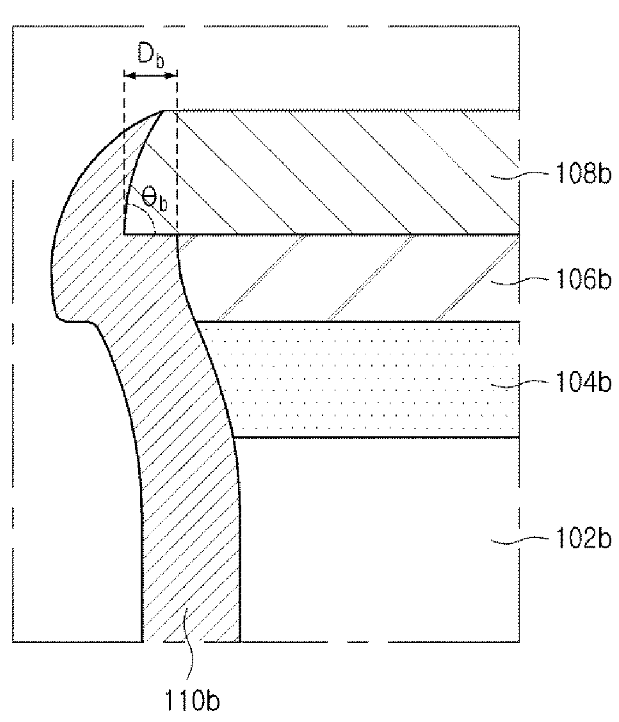
FIG. 5 is a partially enlarged view of region A in FIG. 1, according to example embodiments.

The electrode layer 108 may be disposed, e.g., directly, on the second conductivity type semiconductor 106. For example, as illustrated in FIGS. 1 to 3, the lower surface of the electrode layer 108 may cover the entire upper surface of the second conductivity type semiconductor 106. In another example, as illustrated in FIG. 4, the lower surface of the electrode layer 108 may cover only a partial region of the upper surface of the second conductivity type semiconductor 106. In yet another example, as illustrated in FIG. 5, the lower surface of the electrode layer 108 may cover the entire upper surface of the second conductivity type semiconductor 106 while including a portion protruding from the upper surface of the second conductivity type semiconductor 106.

The electrode layer 108 may be a transparent electrode, e.g., a transparent conductive oxide or a transparent conductive nitride, or may include graphene. For example, the electrode layer 108 may include at least one of Indium Tin Oxide (ITO), Zinc-doped Indium Tin Oxide (ZITO), Zinc Indium Oxide (ZIO), Gallium Indium Oxide (GIO), Zinc Tin Oxide (ZTO), Fluorine-doped Tin Oxide ((FTO), Aluminum-doped Zinc Oxide (AZO), Gallium-doped Zinc Oxide (GZO), and $In_4Sn_3O_{12}$ and $Zn_{(1-x)}Mg_xO$(Zinc Magnesium Oxide, $0 \leq x \leq 1$).

An angle θ between the lower surface and the side surface of the electrode layer 108 may range from about 45° to about 90°, e.g., about 70° to about 90°. When the angle θ between the lower surface and the side surface of the electrode layer 108 has the above range, the side surfaces of the second conductivity type semiconductor 106 and the active layer 104 are not open, and therefore, may be protected by the passivation layer 110.

If the angle θ between the lower surface and the side surface of the electrode layer 108 is less than 45°, the thickness of the passivation layer disposed on the electrode layer 108 may be thinner than the thickness of the passivation layer 110 in the case in which the angle θ is 45° or more. In this case, the passivation layer 110 disposed on the side surface of the electrode layer 108 may be open, thereby exposing side surfaces of the second conductivity type semiconductor 106 and the active layer 104. Accordingly, defects, e.g., leakage current and short circuit, may occur.

The semiconductor light emitting device 100 may have a size of a micro-meter or a nano-meter unit. In detail, as the size of the semiconductor light emitting device 100 is further reduced to a size in nanometer units, the ratio of a damaged area generated on the side surfaces of the second conductivity type semiconductor 106 and the active layer 104, with respect to the cross-sectional area, increases, thereby increasing effects of the damage.

Since the semiconductor light emitting device 100 according to example embodiments includes the electrode layer 108, in which the angle θ between the lower surface and the side surface is 45° or more, e.g., about 70° to about 90°, a sufficient thickness of the passivation layer 110 on the side surface of the electrode layer 108 may be secured. Accordingly, since the side surfaces of the second conductivity type semiconductor 106 and the active layer 104 are not open, defects, e.g., leakage current and short circuit, may be prevented or substantially minimized.

As illustrated in FIG. 1, the first conductivity type semiconductor 102, the active layer 104, the second conductivity type semiconductor 106, and the electrode layer 108 may have different widths, e.g., in the X direction. The first conductivity type semiconductor 102, the active layer 104, the second conductivity type semiconductor 106, and the electrode layer 108 may have a vertical side surface or an oblique side surface. Such a structural difference of the components may be indicated by a difference in the etching rate of respective layers, or the like. For example, the etching rate of the material included in the first conductivity type semiconductor 102 may be greater than the etching rate of the material included in the active layer 104. In an example embodiment, the etching rate of the material included in the active layer 104 may be greater than the etching rate of the material included in the second conductivity type semiconductor 106. Accordingly, the first conductivity type semiconductor 102 may have a first width, the active layer 104 may have a second width equal to or greater than the first width, and the second conductivity type semiconductor 106 may have a third width equal to or greater than the second width of the active layer 104.

The shapes of the first conductivity type semiconductor 102, the active layer 104, the second conductivity type semiconductor 106, and the electrode layer 108 are not limited to those illustrated in FIG. 1. For examples, the shapes of the first conductivity type semiconductor 102, the active layer 104, the second conductivity type semiconductor 106, and the electrode layer 108 may be changed depending on, e.g., the materials included in the respective components, etching conditions, and the like.

The passivation layer 110 may be formed to, e.g., completely, cover external side surfaces of the first conductivity type semiconductor 102, the active layer 104, the second conductivity type semiconductor 106, and the electrode layer 108. For example, as illustrated in FIG. 1, the passivation layer 110 may extend continuously from the lower surface of the first conductivity type semiconductor 102 to an upper surface of the electrode layer 108. The passivation layer 110 may be disposed such that an upper surface of the electrode layer 108 is open, e.g., exposed. For example, as illustrate in FIG. 1, an uppermost point of the passivation layer 110 may be coplanar with the upper surface of the electrode layer 108.

The passivation layer 110 may include an insulating material. For example, the passivation layer 110 may include an oxide, a nitride, or an oxynitride. In an example embodiment, the passivation layer 110 may include at least one of $SiO_2$, SiN, SiON, $TiO_2$, and AlN. For example, as illustrated in FIGS. 1 to 3, the passivation layer 110 may have a single-layer structure. In another example, the passivation layer 110 may have a multilayer structure having the same or different component compositions.

The passivation layer 110 may be disposed to surround an external side surface of the first conductivity type semiconductor 102, e.g., the passivation layer 110 may surround an entire perimeter of the first conductivity type semiconductor 102 in a top view. As illustrated in FIGS. 2A and 2B, the passivation layer 110 may be disposed to have a uniform thickness on the external side surface of the first conductivity type semiconductor 102. In an example embodiment, the passivation layer 110 may have an external side surface substantially the same as or similar to the external side surface of the first conductivity type semiconductor 102.

Upper and lower portions of the passivation layer 110 may have different thicknesses. For example, as illustrated in FIG. 3, the passivation layer 110 may include a first portion disposed on a side surface of the first conductivity type semiconductor 102, and a second portion disposed on the electrode layer 108, and the first portion and the second portion may have different thicknesses, e.g., along the X direction. In the example embodiment illustrated in FIGS. 1 to 3, the first portion may have a first thickness $W_1$, and the second portion may have a second thickness $W_2$ less than the first thickness $W_1$.

In an example embodiment, the first thickness $W_1$ may be about 30 nm or more. If the first thickness $W_1$ is a thickness of less than 30 nm, the passivation layer 110 formed on the side surfaces of the second conductivity type semiconductor 106 and the active layer 104 may be removed by the etching process of the passivation layer 110 to be described later (FIG. 11D and the like), and thus, the side surfaces of the second conductivity type semiconductor 106 and the active layer 104 may be damaged. The upper limit of the first thickness $W_1$ is not particularly limited, and may be determined in consideration of the overall size of the semiconductor light emitting device 100, e.g., the first thickness $W_1$ may be a thickness of about 100 nm or less.

For example, as illustrated in FIG. 3, the first thickness $W_1$ may be a constant thickness, e.g., along the X direction, and the first portion with the first thickness $W_1$ may extend along side surfaces of the first conductivity type semiconductor 102, the second conductivity type semiconductor 106, and the active layer 104. For example, as further illustrated in FIG. 3, the second thickness $W_2$ may be a non-constant thickness, e.g., the second thickness $W_2$ may gradually decrease along the X direction with an increasing distance from the first conductivity type semiconductor 102, and the second portion with the second thickness $W_2$ may extend along the side surface of the electrode layer 108.

The passivation layer 110 may have the same or a similar shape as the side shapes of the electrode layer 108, the second conductivity type semiconductor 106, the active layer 104, and the first conductivity type semiconductor 102. In an example embodiment, at least a portion of the second portion of the passivation layer 110 may have a curved external side surface. For example, as illustrated in FIG. 3, the passivation layer 110 may be conformal along side surfaces of the electrode layer 108, the second conductivity type semiconductor 106, the active layer 104, and the first conductivity type semiconductor 102 to have a same or similar profile.

For example, as illustrated in FIGS. 1 and 3, the passivation layer 110 may have a substantially uniform thickness on the first conductivity type semiconductor 102, the active layer 104, and the second conductivity type semiconductor 106 (i.e., the first thickness $W_1$), and may have a structure in which the thickness becomes thinner toward the top on the electrode layer 108 (i.e., the second thickness $W_2$). In another example, the passivation layer 110 may have a thickness that gradually decreases from bottom to top.

The semiconductor light emitting device 100 according to example embodiments may have a size, e.g., a maximal diameter or width long the X direction, of a micro-meter or a nano-meter unit. For example, the semiconductor light emitting device 100 may have a diameter of about 100 nm to about 1 μm. However embodiments are not limited thereto, e.g., the semiconductor light emitting device 100 may have a relatively greater or smaller diameter.

FIGS. 4 to 8 are partially enlarged views of region A of FIG. 1 according to other example embodiments. In FIGS. 4 to 8, same reference numerals as those of FIGS. 1 to 3 indicate same or similar elements, and same reference numerals as those of FIGS. 1 to 3 with different reference letters indicate different or modified embodiments of elements.

Referring to FIG. 4, a semiconductor light emitting device 100*a* may be substantially the same as that of FIGS. 1 to 3, except that an electrode layer 108*a* may include a side surface that is not aligned with a second conductivity type semiconductor 106*a*. That is, the side surface of the electrode layer 108*a* may be horizontally offset, e.g., spaced apart, from a side surface of the second conductivity type semiconductor 106*a* by a distance $D_a$, such that a portion of the upper surface of the second conductivity type semiconductor 106*a* may be exposed.

The lower surface of the electrode layer 108*a* may have a smaller area (e.g., as viewed in a top view) than the upper surface of the second conductivity type semiconductor 106*a* (e.g., as viewed in a top view) and may be disposed to cover only a portion of the upper surface of the second conductivity type semiconductor 106*a*. The electrode layer 108*a* may be disposed to overlap the second conductivity type semiconductor 106*a* in a vertical direction, e.g., along the Z direction. The lower surface of the electrode layer 108*a* may have a smaller width than the upper surface of the second conductivity type semiconductor 106*a*, e.g., along the X direction.

The perimeter of the lower surface of the electrode layer 108*a* may be spaced apart from the perimeter of the upper surface of the second conductivity type semiconductor 106*a* inwardly by the distance $D_a$, e.g., the perimeter of the lower surface of the electrode layer 108*a* may be spaced apart radially from the perimeter of the upper surface of the second conductivity type semiconductor 106*a* in a direction oriented inwardly toward a center of the electrode layer 108*a*. The distance $D_a$ may range of about 30 nm to about 50 nm. Since the distance $D_a$ has the above range, the side surfaces of the second conductivity type semiconductor 106*a* and the active layer 104*a* may not be exposed by an etching process (e.g., FIG. 12D and the like) of the passivation layer 110*a* to be described later. The second conductivity type semiconductor 106*a* and the active layer 104*a* may be protected by the passivation layer 110*a*. The angle θa between the lower surface and the side surface of the electrode layer 108*a* may not be limited.

The passivation layer 110*a* may be disposed to cover an upper surface of the second conductivity type semiconductor 106*a*, which is not covered by the lower surface of the electrode layer 108*a*. The passivation layer 110*a* may be disposed to cover a side surface of the electrode layer 108*a*, a side surface of the second conductivity type semiconductor 106*a*, a portion of an upper surface of the second conductivity type semiconductor 106*a* connected to (e.g., extending directly from) the side surface, a side surface of the active layer 104*a*, and a side surface of the first conductivity type semiconductor 102*a*. The passivation layer 110*a* may have a thickness of about 30 nm to about 100 nm on the side surfaces of the second conductivity type semiconductor 106*a*, the active layer 104*a*, and the first conductivity type semiconductor 102*a*, and may have a maximum thickness on the side surface of the electrode layer 108*a*.

Referring to FIG. 5, a semiconductor light emitting device 100*b* may be substantially the same as that of FIGS. 1 to 3, except that an electrode layer 108*b* may include a side surface that is not aligned with a second conductivity type semiconductor 106*b*. That is, the side surface of the electrode layer 108*b* may be horizontally offset, e.g., spaced apart, from a side surface of the second conductivity type semiconductor 106*b* by a distance $D_b$, such that the electrode layer 108*b* extends beyond the second conductivity type semiconductor 106*b* to overhang the second conductivity type semiconductor 106*b*.

The lower surface of the electrode layer 108*b* may have a larger area than the upper surface of the second conductivity type semiconductor 106*b* and may be disposed to cover the entire upper surface of the second conductivity type semiconductor 106*b*. The electrode layer 108*b* may be disposed to overlap the second conductivity type semiconductor 106*b*. The lower surface of the electrode layer 108*b* may have a greater width than the upper surface of the second conductivity type semiconductor 106*b*.

The perimeter of the lower surface of the electrode layer 108*b* may be spaced apart outwardly from the perimeter of the upper surface of the second conductivity type semiconductor 106*b* by the distance $D_b$, e.g., the perimeter of the lower surface of the electrode layer 108*b* may be spaced apart radially from the perimeter of the upper surface of the second conductivity type semiconductor 106*b* in a direction oriented outwardly (e.g., away) from a center of the electrode layer 108*b*. The distance $D_b$ may range from about 30 nm to about 50 nm. Since the distance $D_b$ has the above range, the side surfaces of the second conductivity type semiconductor 106*b* and the active layer 104*b* may not be exposed by an etching process (e.g., FIG. 14C and the like) of the passivation layer 110*b* to be described later. The second conductivity type semiconductor 106*b* and the active layer 104*b* may be protected by the electrode layer 108*b*. The angle θb between the lower surface and the side surface of the electrode layer 108*b* may not be limited.

The passivation layer 110*b* may be disposed to cover the lower surface of the electrode layer 108*b*, not covered by the upper surface of the second conductivity type semiconductor 106*b*. The passivation layer 110*b* may be disposed to cover a side surface of the electrode layer 108*b* and a portion of a lower surface connected to the side surface, a side surface of the second conductivity type semiconductor 106*b*, a side surface of the active layer 104*b*, and a side surface of a first conductivity type semiconductor 102*b*. The passivation layer 110*b* may have a thickness of about 30 nm to about 100 nm on the side surfaces of the second conductivity type semiconductor 106*b*, the active layer 104*b* and the first conductivity type semiconductor 102*b*, and may have a minimum thickness on the side surface of the electrode layer 108*b*.

Figure 6:
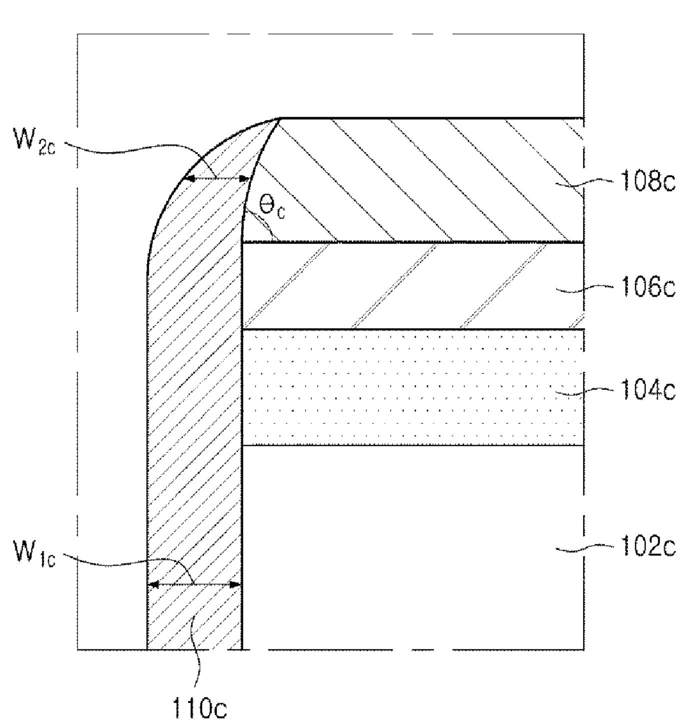
FIG. 6 is a partially enlarged view of region A in FIG. 1, according to example embodiments.
Figure 7:
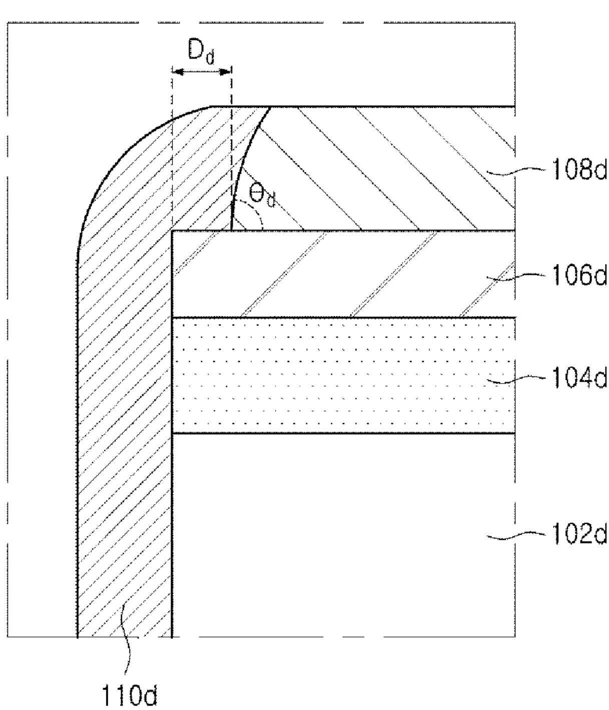
FIG. 7 is a partially enlarged view of region A in FIG. 1, according to example embodiments.
Figure 8:
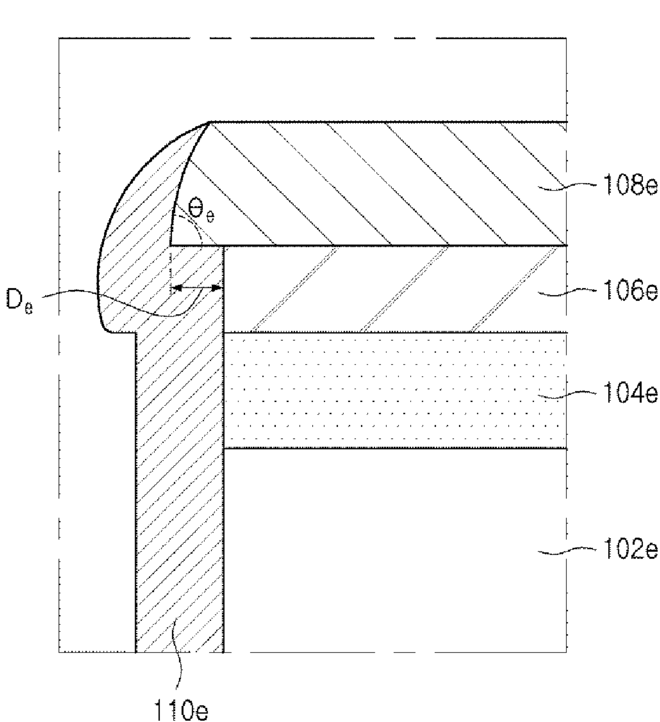
FIG. 8 is a partially enlarged view of region A in FIG. 1, according to example embodiments.

Referring to FIGS. 6 to 8, semiconductor light emitting devices 100*c*, 100*d*, and 100*e* may be substantially the same as those of FIGS. 3 to 5, respectively, except for the slopes of the first conductivity type semiconductor, the active layer, and the second conductivity type semiconductor. That is, as illustrated in FIGS. 6 to 8, first conductivity type semiconductors 102*c*, 102*d* and 102*e*, active layers 104*c*, 104*d* and 104*e*, and second conductivity type semiconductors 106*c*, 106*d* and 106*e* may have side surfaces aligned with each other.

In the semiconductor light emitting devices 100*c* to 100*e* having the above-described characteristics, damage to the side surfaces of the active layer and the second conductivity type semiconductor may be prevented regardless of side slopes of the first conductivity type semiconductor, the active layer, and the second conductivity type semiconductor.

In the example embodiment of FIG. 6, the lower surface and the side surfaces of an electrode layer 108*c* may have an angle θc in a range of about 45° to about 90°. The second conductivity type semiconductor 106*c* and the active layer 104*c* may be protected by the passivation layer 110*c*. The passivation layer 110*c* may have a first portion with a first thickness $W_{1C}$ and a second portion with a second thickness $W_{2C}$, as discussed previously with reference to FIG. 3.

In the example embodiment of FIG. 7, the lower surface of the electrode layer 108*d* may have a smaller area than the upper surface of the second conductivity type semiconductor 106*d*, and may be disposed to cover only a portion of the upper surface of the second conductivity type semiconductor 106*d*, e.g., the side surface of the electrode layer 108*d* may be inclined at an angle θd and spacer apart from the second conductivity type semiconductor 106*d* by a distance $D_d$. The upper surface of the second conductivity type semiconductor 106*d*, not covered by the electrode layer 108*d*, may be covered by the passivation layer 110*d*. The second conductivity type semiconductor 106*d* and the active layer 104*d* may be protected by the passivation layer 110*d*.

In the example embodiment of FIG. 8, the lower surface of the electrode layer 108*e* may have a larger area than the upper surface of the second conductivity type semiconductor 106*e*, e.g., the side surface of the electrode layer 108*e* may be inclined at an angle θe and spacer apart from the second conductivity type semiconductor 106*e* by a distance $D_e$, and may be disposed to cover the entire upper surface of the second conductivity type semiconductor 106*e*. The second conductivity type semiconductor 106*e* and the active layer 104*e* may be protected by the electrode layer 108*e*.

The shapes and slopes of the side surfaces of the first conductivity type semiconductor, the active layer, and the second conductivity type semiconductor are not limited to those illustrated in FIGS. 3 to 8. In another embodiment, the active layer may have a width narrower than that of the first and second conductivity type semiconductors. In the semiconductor light emitting device according to the example embodiments, damage to side surfaces of the active layer and the second conductivity type semiconductor may be prevented regardless of the shapes of the first conductivity type semiconductor, the active layer, and the second conductivity type semiconductor.

Figure 9:
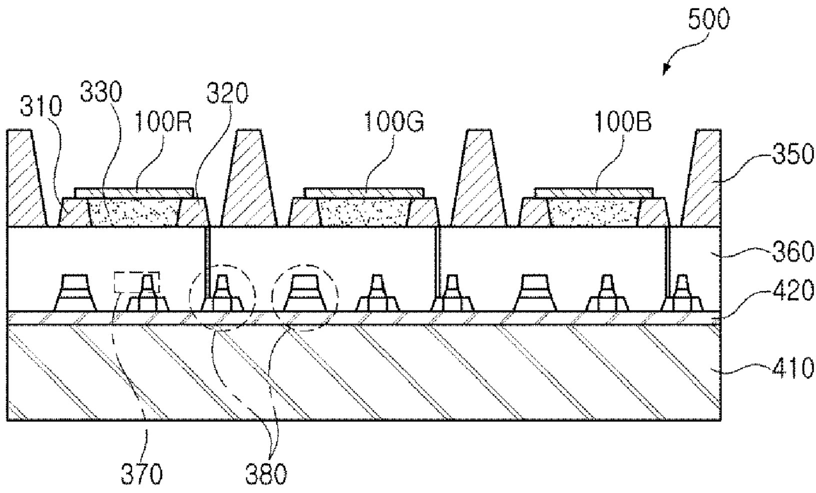
FIG. 9 is a side cross-sectional view of a display device according to example embodiments.
Figure 10:
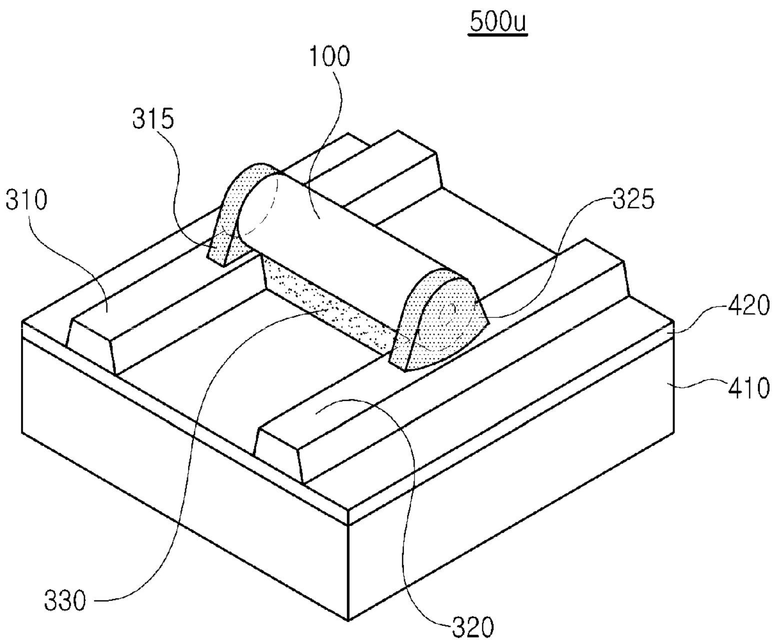
FIG. 10 is a perspective view of one pixel in the display device of FIG. 9.

Semiconductor light emitting devices 100, 100*a*, 100*b*, 100*c*, 100*d*, and 100*e* in FIGS. 1 to 8 described above may be used as light sources constituting respective pixels of a display device. FIG. 9 is a cross-sectional side view illustrating a display device employing a semiconductor light emitting device according to example embodiments, and FIG. 10 is a perspective view of one pixel 500*u* of the display device in FIG. 9.

Referring to FIG. 9, a display apparatus 500 according to example embodiments may include semiconductor light emitting devices 100R, 100G, and 100B having a nanorod structure disposed in respective pixel areas. The semiconductor light emitting devices 100R, 100G, and 100B having a nanorod structure may be configured to emit red, green, and blue light, respectively. Each pixel may be defined by a pixel defining layer 350.

The semiconductor light emitting devices 100R, 100G, and 100B may respectively have a length that may be disposed between first and second electrode parts 310 and 320. Each of the semiconductor light emitting devices 100R, 100G, and 100B may be self-aligned between the first and second electrode parts 310 and 320 using an electric bias, and may be fixed by an insulating support 330.

Driving circuit elements 380, e.g., transistors and capacitors, and an insulating layer 360 covering the same may further be disposed between a substrate 410 and the semiconductor light emitting devices 100R, 100G, and 100B. A buffer layer 420 may be formed on the substrate 410.

In an example embodiment, a reflective layer 370 may be further disposed below each of the semiconductor light emitting devices 100R, 100G, and 100B. The reflective layer 370 may be formed separately from the circuit elements 380, or may be formed integrally with at least one circuit element 380. For example, the reflective layer 370 may be formed by expanding the area of at least one of the electrodes constituting one or more transistors and/or capacitors.

FIG. 10 is a perspective view illustrating one pixel 500*u* of the display device illustrated in FIG. 9. For convenience of description, the driving circuit elements 380 and the insulating layer 360 disposed between the substrate 410 and the semiconductor light emitting devices 100R, 100G, and 100B are omitted in the drawing.

Referring to FIG. 10, the semiconductor light emitting device 100 may be disposed between the first electrode part 310 and the second electrode part 320 in the longitudinal direction thereof. The electrode layer and the first conductivity type semiconductor of the semiconductor light emitting device 100 may be connected to the first and second electrode parts 310 and 320 by first and second connection electrodes 315 and 325, respectively. The first and second connection electrodes 315 and 325 may be formed of a transparent conductive material, e.g., ITO, IZO, or ITZO.

FIGS. 11A to 11E are cross-sectional views of stages in a method of manufacturing the semiconductor light emitting device 100 illustrated in FIGS. 1 and 3 according to example embodiments.

Figure 11A:
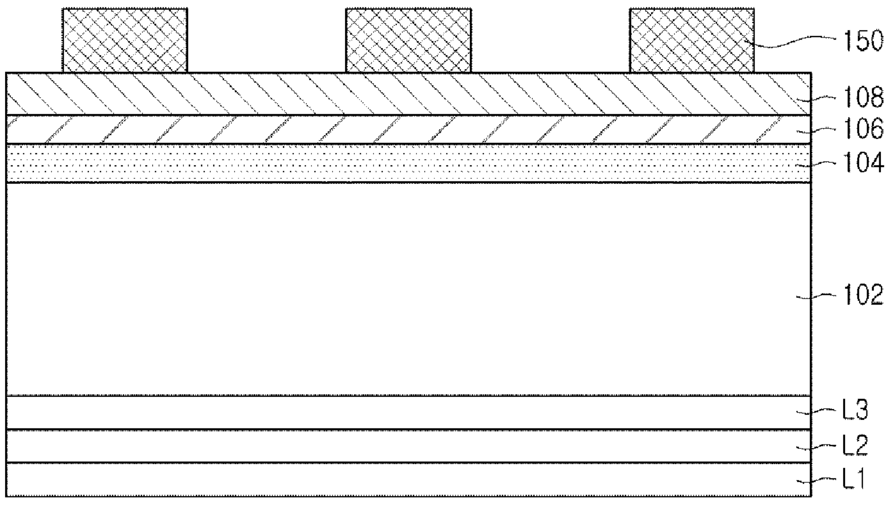

Referring to FIG. 11A, a semiconductor stack, in which a buffer material layer L2, a separation layer L3, the first conductivity type semiconductor 102, the active layer 104, the second conductivity type semiconductor 106, and the electrode layer 108 are sequentially stacked on a base substrate L1, may be formed.

For example, a base substrate L1 may include a transparent substrate (e.g., sapphire ($Al_2O_3$), glass, or the like). In another example, the base substrate L1 may include a conductive material (e.g., GaN, SiC, ZnO, Si, GaP, GaAs, and the like).

The buffer material layer L2 may be formed on the base substrate L1. The buffer material layer L2 may be for alleviating lattice defects of the first conductivity type semiconductor 102 formed on the base substrate L1. The buffer material layer L2 may include, e.g., an undoped semiconductor. In an example embodiment, the buffer material layer L2 may include substantially the same material as the first conductivity type semiconductor 102, but the material may be an n-type or p-type undoped material. In an example embodiment, the buffer material layer L2 may include at least one of an undoped InAlGaN, GaN, AlGaN, GaInP, AlN and InN containing nitrogen (N), or an undoped InAlGaP, GaP, AlGaP, GaInP, AlP, and InP containing phosphorus (P).

The separation layer L3 may be disposed on the buffer material layer L2. The separation layer L3 may include a material that allows the crystals of the first conductivity type semiconductor 102 formed thereon to grow smoothly. In an example embodiment, the separation layer L3 may include an insulating material (e.g., silicon oxide ($SiO_x$), silicon nitride ($SiN_x$), silicon oxynitride ($SiO_xN_y$), or the like), or a conductive material (e.g., AlAs, AlGaAs, ITO, IZO, IGO, ZnO, graphene, graphene oxide, or the like).

The first conductivity type semiconductor 102, the active layer 104, the second conductivity type semiconductor 106, and the electrode layer 108 may be sequentially formed on the separation layer L3. The first conductivity type semiconductor 102, the active layer 104, the second conductivity type semiconductor 106, and the electrode layer 108 may be respectively formed by, e.g., electron beam deposition, physical vapor deposition (PVD), chemical vapor deposition (CVD), plasma laser deposition (PLD), dual-type thermal evaporation, sputtering, metal organic chemical vapor deposition (MOCVD), or the like.

A mask pattern 150 may be formed on the electrode layer 108. The mask pattern 150 may be, e.g., a circular or hexagonal pattern. The mask pattern 150 may include, e.g., nitride or oxynitride.

Figure 11B:
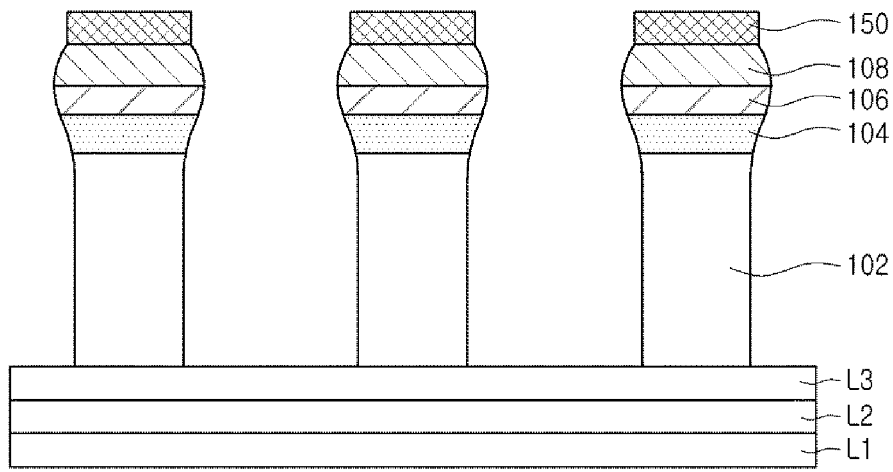

Referring to FIG. 11B, the semiconductor stack may be etched using the mask pattern 150. For example, a dry etching process, e.g., an Inductively Coupled Plasma-Reactive Ion Etching (ICE-ME) plasma etching process, may be used.

The first conductivity type semiconductor 102, the active layer 104, the second conductivity type semiconductor 106, and the electrode layer 108 may have different shapes by etching.

The shapes of the first conductivity type semiconductor 102, the active layer 104, the second conductivity type semiconductor 106, and the electrode layer 108 may be determined depending on the rod length of the first conductivity type semiconductor 102, the component composition (e.g., the content of indium (In)) of each layer, the etching rate, or the like. In an example embodiment, the etching rate of the first conductivity type semiconductor 102 may be greater than the etching rate of the second conductivity type semiconductor 106. Therefore, the first conductivity type semiconductor 102 may have a width narrower than a width of the second conductivity type semiconductor 106. However, the shapes of the first conductivity type semiconductor 102, the active layer 104, and the second conductivity type semiconductor 106 are not limited thereto, e.g., the first conductivity type semiconductor 102, the active layer 104, and the second conductivity type semiconductor 106 may be etched to have side surfaces that are vertically aligned with each other to form the semiconductor light emitting device 100*c* illustrated in FIG. 6.

The electrode layer 108 may be etched such that an angle between the lower surface and the side surface is 45° or more, e.g., 70° or more. An angle between the lower surface and the side surface of the electrode layer 108 may be controlled by adjusting the shape of the mask pattern 150, the component composition of the electrode layer 108, etching conditions or the like. In FIG. 11B, the mask pattern 150 is illustrated as having a rectangular cross section, but is not limited thereto, e.g., the mask pattern 150 may have a trapezoidal cross section or a curved side surface.

Figure 11C:
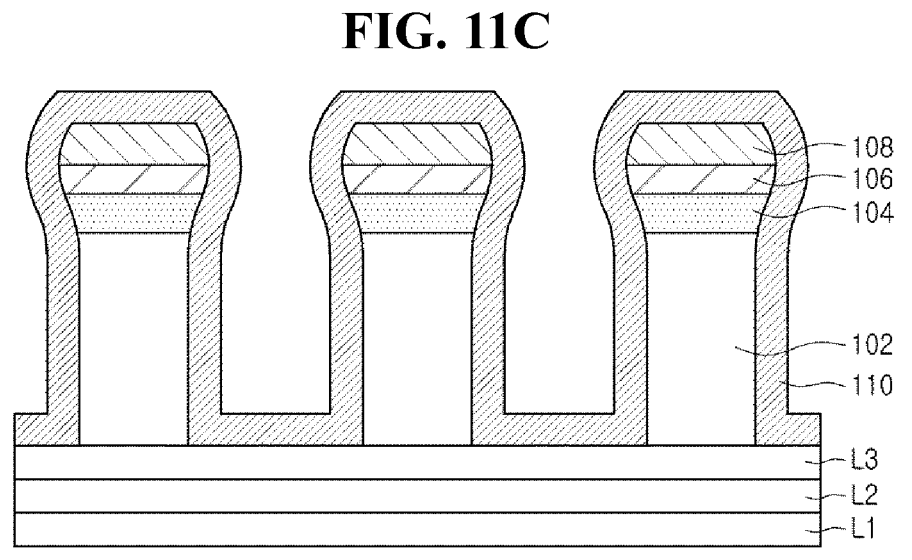

Referring to FIG. 11C, the passivation layer 110 may be formed to surround the first conductivity type semiconductor 102, the active layer 104, the second conductivity type semiconductor 106, and the electrode layer 108. For example, as illustrated in FIG. 11C, the passivation layer 110 may conformally and continuously cover the structure on the separation layer L3.

The passivation layer 110 may protect the second conductivity type semiconductor 106 and the active layer 104 from damage during a subsequent etching process. The passivation layer 110 may be conformally formed over the entire surface. Since the passivation layer 110 is deposited over the entire surface, in addition to the side surfaces of the first conductivity type semiconductor 102, the active layer 104, the second conductivity type semiconductor 106, and the electrode layer 108, the passivation layer 110 may also be deposited on the upper surface of the electrode layer 108 and on the upper surface of the separation layer L3.

In an example embodiment, the passivation layer 110 may include an insulating material, e.g., at least one of $SiO_2$, SiN, SiON, $TiO_2$ and AlN. In another embodiment, the passivation layer 110 may include a semiconductor material having a relatively low conductivity. The passivation layer 110 may have a thickness of about 30 nm or more, e.g., about 30 nm to about 100.

Figure 11D:
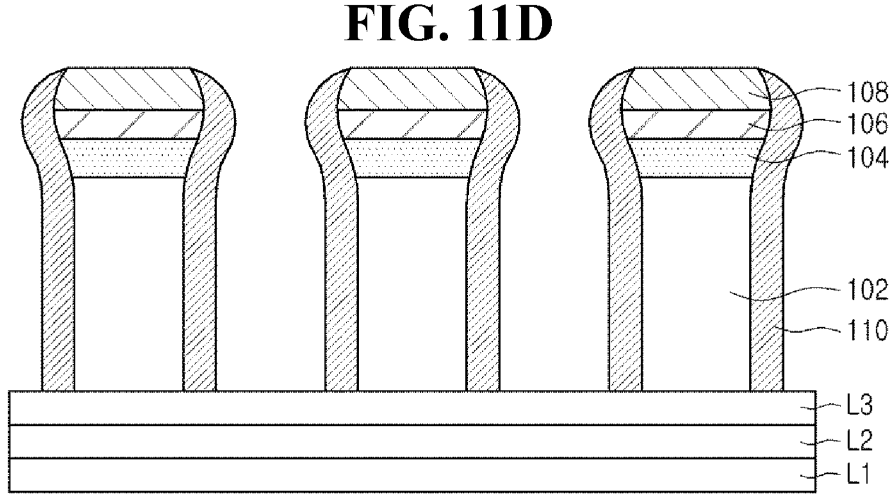

Referring to FIG. 11D, the passivation layer 110 formed in an unwanted region may be selectively removed to expose the upper surface of the electrode layer 108.

The passivation layer 110 formed on the upper surface of the electrode layer 108 and the upper surface of the separation layer L3 may be etched. While the upper surface of the electrode layer 108 is exposed, the passivation layer 110 may be provided on the side surfaces of the electrode layer 108, the second conductivity type semiconductor 106, the active layer 104, and the first conductivity type semiconductor 102.

In the process of removing the passivation layer 110 formed on the upper surface of the electrode layer 108, a portion of the passivation layer 110 formed on the side surface of the electrode layer 108 may be removed together. Since the angle between the side surface and the lower surface of the electrode layer 108 is 45° or more, e.g., 70° or more, the passivation layer 110 having a sufficient thickness may be formed on the side surface of the electrode layer 108. Accordingly, the side surfaces of the electrode layer 108, the second conductivity type semiconductor 106, and the active layer 104 may not be exposed by the etching of the passivation layer 110. Accordingly, defects, e.g., leakage current and short circuit of the semiconductor light emitting device, may not occur.

Figure 11E:
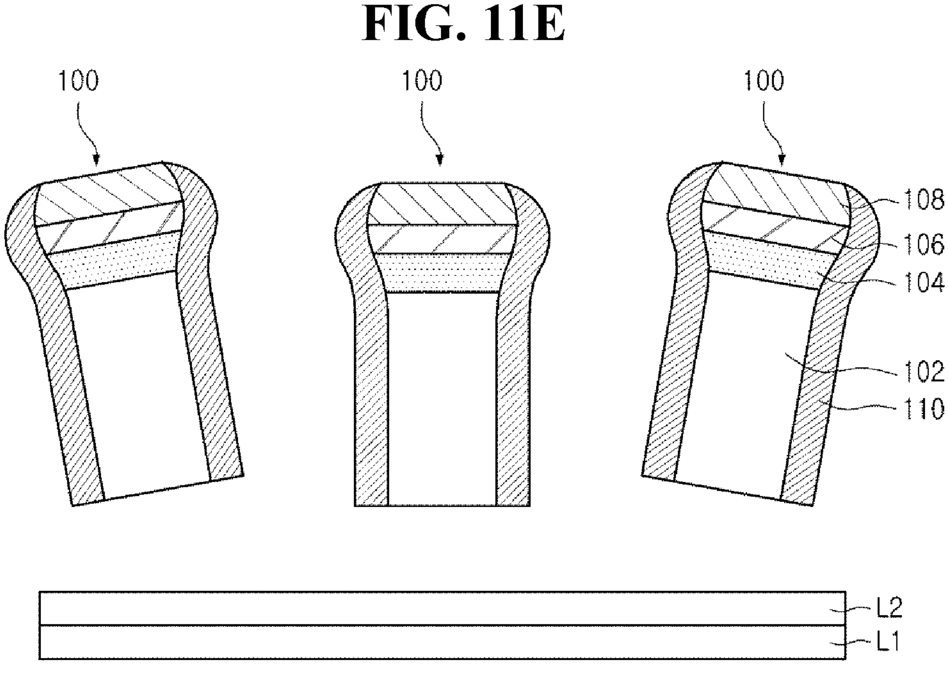

Referring to FIG. 11E, the separation layer L3 may be removed to separate the semiconductor light emitting device 100 from the base substrate L1. The separation layer L3 may be removed, e.g., by a chemical method. The semiconductor light emitting device 100 separated from the base substrate L1 may be the same as or similar to the example embodiment illustrated in FIG. 1.

FIGS. 12A to 12F are cross-sectional views of stages in a method of manufacturing the semiconductor light emitting device 100*a* in FIG. 4 according to example embodiments. In the manufacturing method of FIGS. 12A to 12F, features described with the same reference numerals as in FIGS. 11A to 11E may be the same or similar.

Figure 12A:
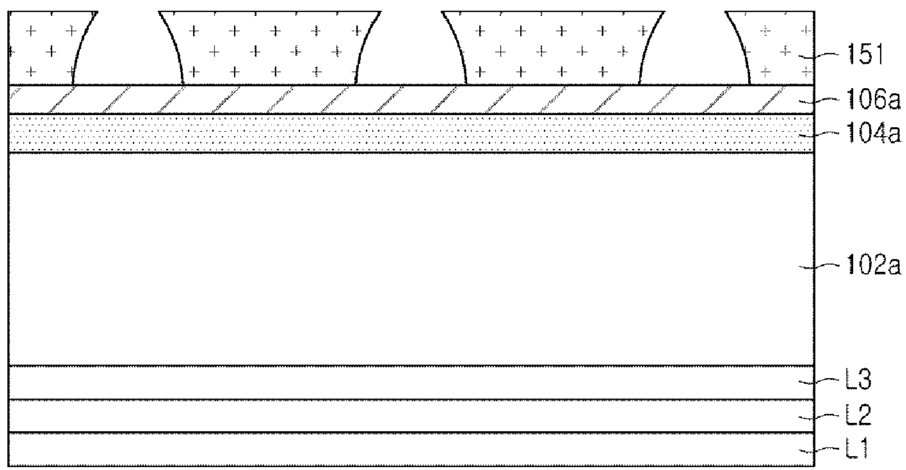

Referring to FIG. 12A, the buffer material layer L2, the separation layer L3, the first conductivity type semiconductor 102*a*, the active layer 104*a*, and the second conductivity type semiconductor 106*a* may be sequentially formed on the base substrate L1. Thereafter, a first mask pattern 151 may be formed on the upper surface of the second conductivity type semiconductor 106*a*. The first mask pattern 151 may include a plurality of patterns spaced apart from each other in the horizontal direction.

The first mask pattern 151 may be formed to have a side surface forming a specific angle with respect to the upper surface of the second conductivity type semiconductor 106*a*. The angle formed between the side surface of the first mask pattern 151 and the upper surface of the second conductivity type semiconductor 106*a* may determine the angle between the lower surface and the side surface of the electrode layer 108*a* in the process of FIG. 12B to be described later.

For example, as illustrated in FIG. 12A, the side surface of the first mask pattern 151 may be inclined, e.g., at an oblique angle, with respect to the upper surface of the second conductivity type semiconductor 106*a*. In another example, the side surface of the first mask pattern 151 may be formed to have an angle of 90° with respect to the upper surface of the second conductivity type semiconductor 106*a*.

Figure 12B:
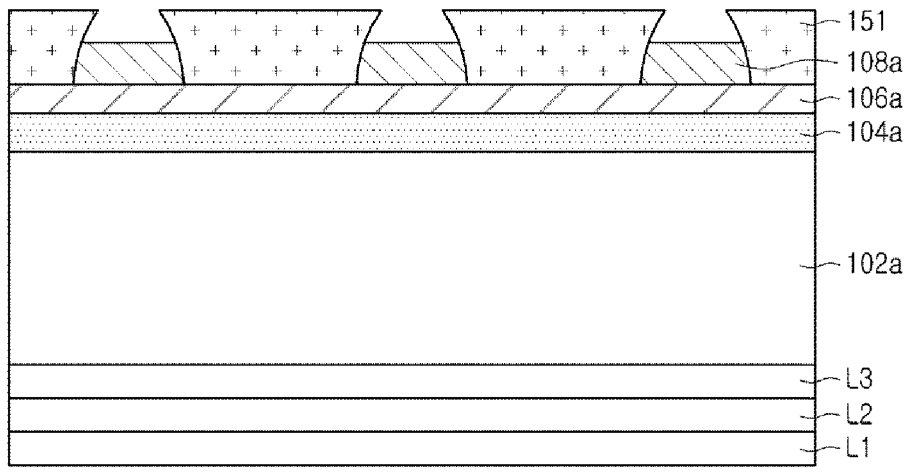

Referring to FIG. 12B, the electrode layer 108*a* may be formed between the spaced apart first mask patterns 151. For example, as illustrated in FIG. 12B, the electrode layer 108*a* may be formed to contact, e.g., and fill a distance between, facing sidewalls of adjacent first mask patterns 151.

The side surface of the electrode layer 108*a* may be formed to have the same or a similar shape to the side surface of the first mask pattern 151. In the example embodiment of FIG. 12B, the angle between the lower surface and the side surface of the electrode layer 108*a* is illustrated as an acute angle, but is not limited thereto, e.g., the angle between the lower surface and the side surface of the electrode layer 108*a* may be 90° or more.

Figure 12C:
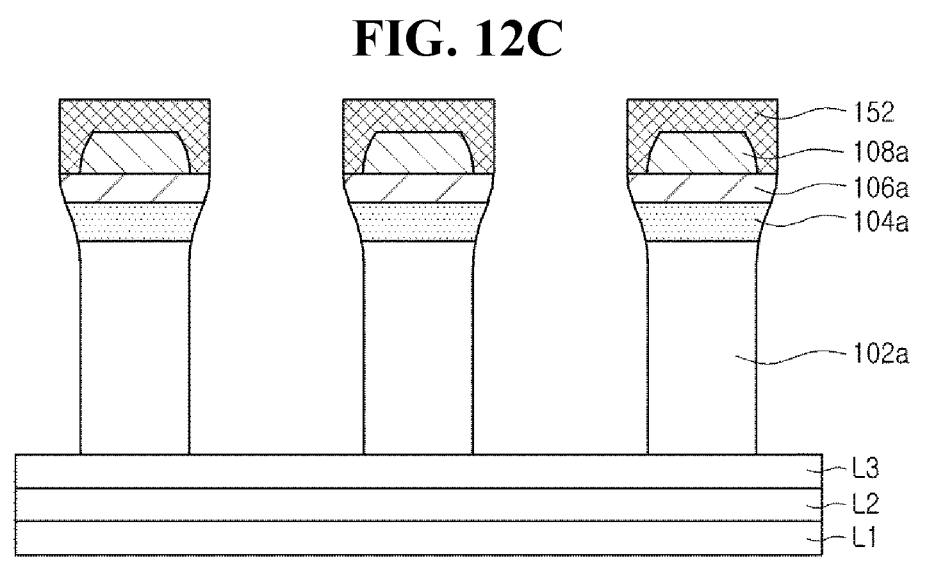

Referring to FIG. 12C, the first mask patterns 151 (FIG. 12B) may be removed, and a second mask pattern 152 surrounding the electrode layer 108*a* may be formed. The second mask pattern 152 may be formed to surround the entire upper surface and side surfaces of the electrode layer 108*a* and to cover at least a portion of the upper surface of the second conductivity type semiconductor 106*a*.

Thereafter, the second conductivity type semiconductor 106*a*, the active layer 104*a*, and the first conductivity type semiconductor 102*a* may be etched using the second mask pattern 152. The second conductivity type semiconductor 106*a* may be etched to have an upper surface wider than a lower surface of the electrode layer 108*a* by the second mask pattern 152.

The first conductivity type semiconductor 102*a*, the active layer 104*a*, and the second conductivity type semiconductor 106*a* may have different shapes by etching. The shapes of the first conductivity type semiconductor 102*a*, the active layer 104*a*, and the second conductivity type semiconductor 106*a* may be determined depending on the rod length of the first conductivity type semiconductor 102, the etching rate according to the component composition (e.g., the content of indium (In)) of each layer, etching amount, or the like. For example, as illustrated in FIG. 12C, the widths may gradually decrease in the order of the second conductivity type semiconductor 106*a*, the active layer 104*a*, and the first conductivity type semiconductor 102*a* is illustrated. In another embodiment, as illustrated in FIG. 7, the second conductivity type semiconductor 106*a*, the active layer 104*a*, and the first conductivity type semiconductor 102*a* may be etched to have vertically aligned side surfaces, thereby forming the semiconductor light emitting device 100*d* in FIG. 7.

Figure 12D:
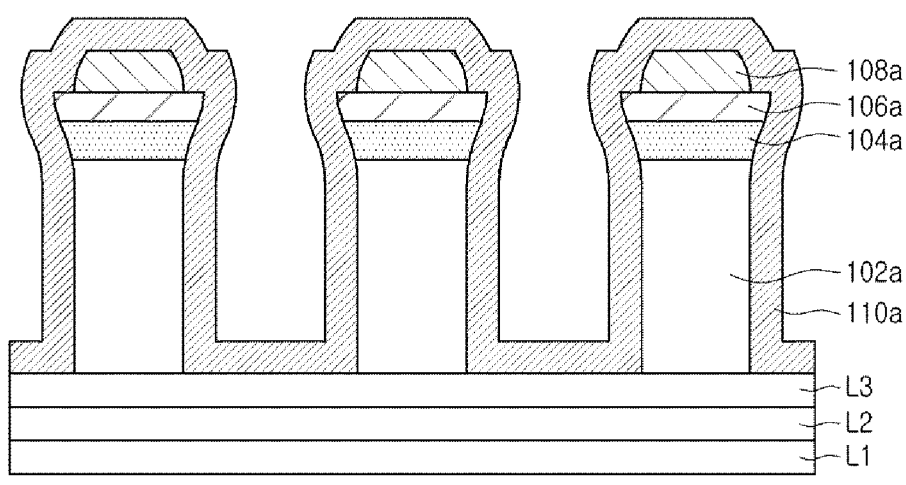

Referring to FIG. 12D, a passivation layer 110*a* may be formed to surround the first conductivity type semiconductor 102*a*, the active layer 104*a*, the second conductivity type semiconductor 106*a*, and the electrode layer 108*a*.

Since the electrode layer 108*a* is formed on a portion of the upper surface of the second conductivity type semiconductor 106*a*, the passivation layer 110*a* may be formed to cover, e.g., to directly contact and cover, at least a portion of the upper surface of the second conductivity type semiconductor 106*a*, which is not covered by the lower surface of the electrode layer 108*a*. Since the passivation layer 110*a* is deposited over the entire surface, in addition to the side surfaces of the first conductivity type semiconductor 102*a*, the active layer 104*a*, the second conductivity type semiconductor 106*a*, and the electrode layer 108*a*, the passivation layer 110*a* may also be deposited on the upper surface of the electrode layer 108*a* and the upper surface of the separation layer L3.

Figure 12E:
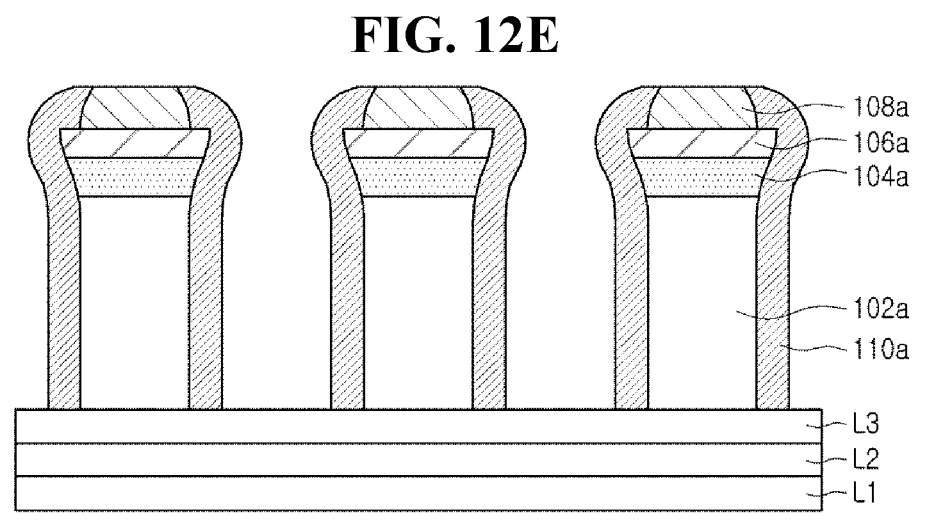

Referring to FIG. 12E, the passivation layer 110*a* formed in an unwanted region may be selectively removed to expose the upper surface of the electrode layer 108*a*.

The passivation layer 110*a* formed on the upper surface of the electrode layer 108*a* and the upper surface of the separation layer L3 may be etched. While the upper surface of the electrode layer 108*a* is exposed, the passivation layer 110*a* may be formed on the side surfaces of the electrode layer 108*a*, the second conductivity type semiconductor 106*a*, the active layer 104*a*, and the first conductivity type semiconductor 102*a*.

In the process of removing the passivation layer 110*a*, a portion of the passivation layer 110*a* formed on the side surface of the electrode layer 108*a* may be removed together. The passivation layer 110*a* may be etched to have rounded edges.

As illustrated in FIG. 12E, the passivation layer 110*a* may be formed to cover an edge region including the outer periphery of the upper surface of the second conductivity type semiconductor 106*a*. The second conductivity type semiconductor 106*a* and the active layer 104*a* may be protected by the passivation layer 110*a*. Therefore, in the process of etching the passivation layer 110*a*, the side surfaces of the second conductivity type semiconductor 106*a* and the active layer 104*a* are not exposed, and defects, e.g., leakage current and short circuit of the semiconductor light emitting device, may be prevented or substantially minimized.

Figure 12F:
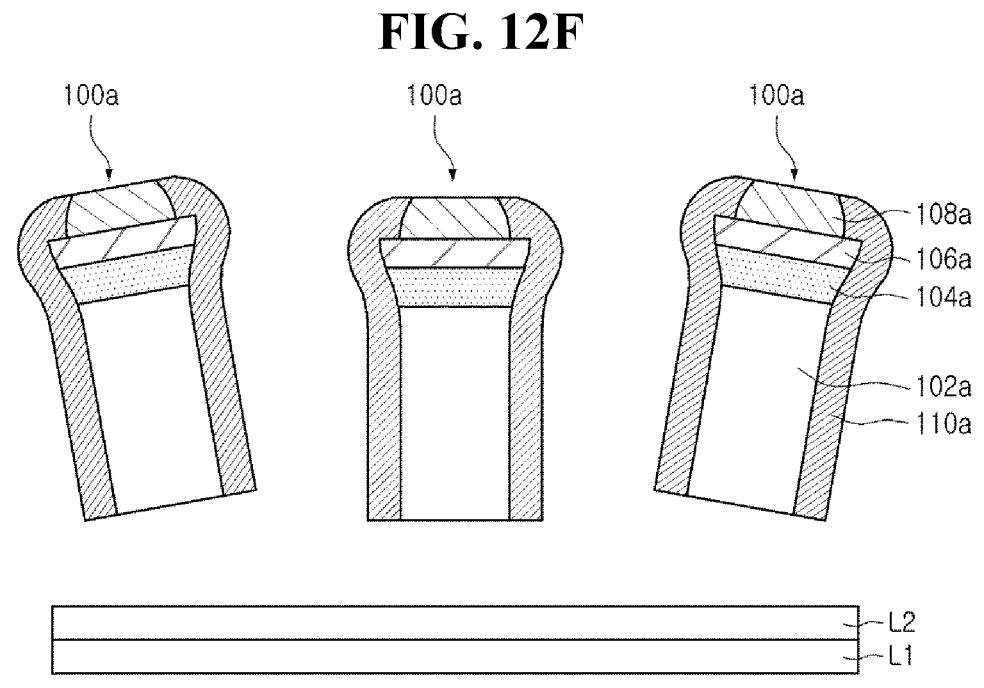

Referring to FIG. 12F, the separation layer L3 may be removed to separate the semiconductor light emitting device 100*a* from the base substrate L1. The separation layer L3 may be removed, e.g., by a chemical method. The semiconductor light emitting device 100*a* separated from the base substrate L1 may be the same as or similar to that in the example embodiment illustrated in FIG. 4.

Next, FIGS. 13A to 13E are cross-sectional views of stages in a method of manufacturing the semiconductor light emitting device 100*a* illustrated in FIG. 4 according to example embodiments. In the manufacturing method of FIGS. 13A to 13E, the semiconductor light emitting device 100*a* substantially the same as that of FIGS. 12A to 12F may be manufactured, but the manufacturing method thereof may be different. In the manufacturing method of FIGS. 13A to 13E, features described with the same reference numerals as in FIGS. 11A to 12F may be the same or similar thereto.

Figure 13A:
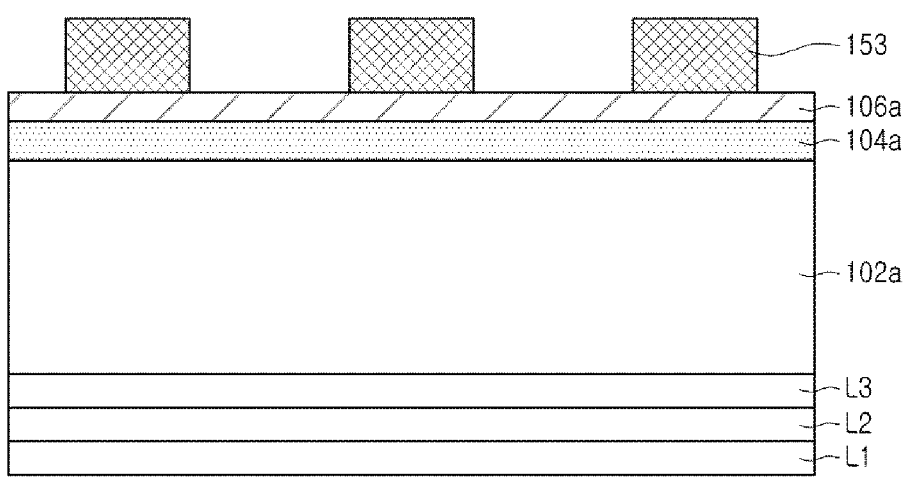

Referring to FIG. 13A, the buffer material layer L2, the separation layer L3, the first conductivity type semiconductor 102*a*, the active layer 104*a*, and the second conductivity type semiconductor 106*a* may be sequentially formed on the base substrate L1. Thereafter, a first mask pattern 153 may be formed on the upper surface of the second conductivity type semiconductor 106*a*. The first mask pattern 151 may include a plurality of patterns spaced apart from each other in the horizontal direction.

Figure 13B:
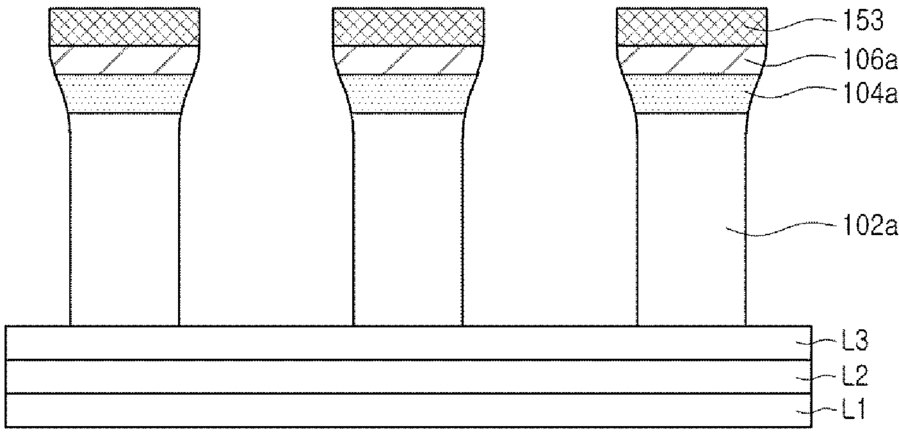

Referring to FIG. 13B, the semiconductor stack may be etched using the first mask pattern 153. For example, a dry etching process, e.g., an Inductively Coupled Plasma-Reactive Ion Etching (ICE-RIE) plasma etching process, may be used.

In an example embodiment, the first conductivity type semiconductor 102*a*, the active layer 104*a*, and the second conductivity type semiconductor 106*a* may be etched to have different shapes by etching. However, the shapes of the first conductivity type semiconductor 102*a*, the active layer 104*a*, and the second conductivity type semiconductor 106*a* are not limited thereto. In another embodiment, the first conductivity type semiconductor 102*a*, the active layer 104*a*, and the second conductivity type semiconductor 106*a* may be etched to have side surfaces that are vertically aligned with each other, thereby manufacturing the semiconductor light emitting device 100*c* illustrated in FIG. 6.

Figure 13C:
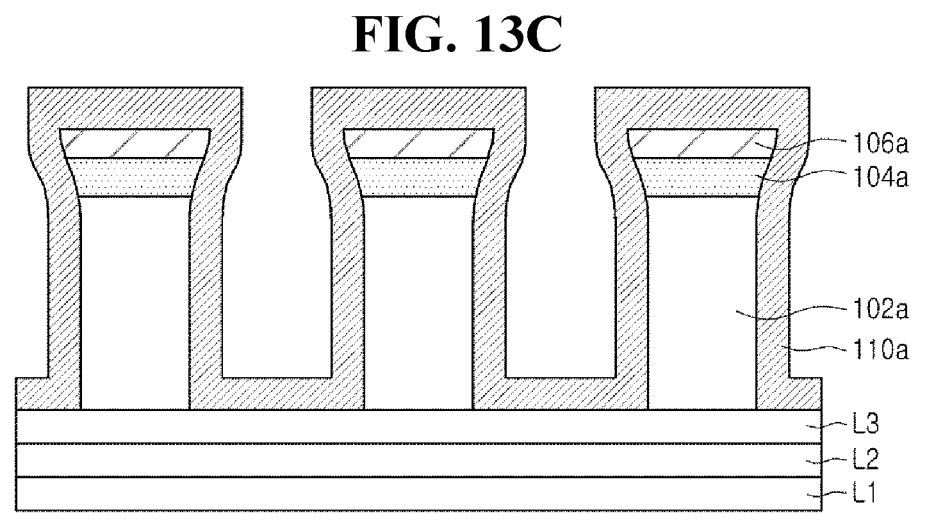

Referring to FIG. 13C, the passivation layer 110*a* may be formed to surround the first conductivity type semiconductor 102*a*, the active layer 104*a*, and the second conductivity type semiconductor 106*a*. Since the passivation layer 110*a* is deposited on the entire surface, in addition to the side surfaces of the first conductivity type semiconductor 102*a*, the active layer 104*a*, and the second conductivity type semiconductor 106*a*, the passivation layer 110*a* may also be deposited on the upper surface of the second conductivity type semiconductor 106*a* and on the upper surface of the separation layer L3.

Figure 13D:
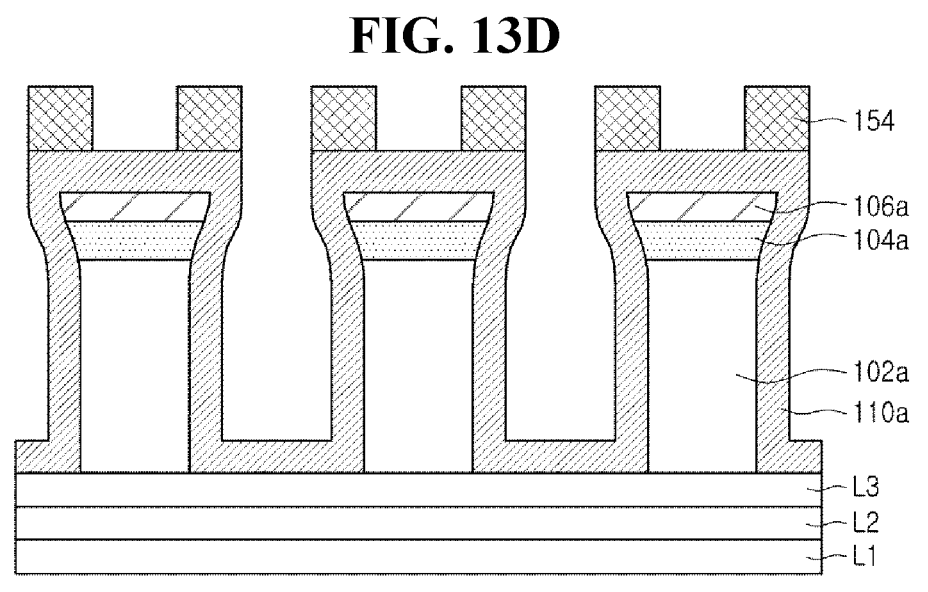

Referring to FIG. 13D, a second mask pattern 154 may be formed on the upper surface of the passivation layer 110*a*.

The second mask pattern 154 may include a plurality of patterns spaced apart from each other. The second mask pattern 154 may include a side surface aligned with the external side surface of the passivation layer 110*a*. In the example embodiment of FIG. 13D, the second mask pattern 154 is illustrated to have a rectangular cross-section, but is not limited thereto, e.g., the second mask pattern 154 may have a trapezoidal cross-section or a curved side surface. The second mask pattern 154 may include, e.g., nitride or oxynitride.

Figure 13E:
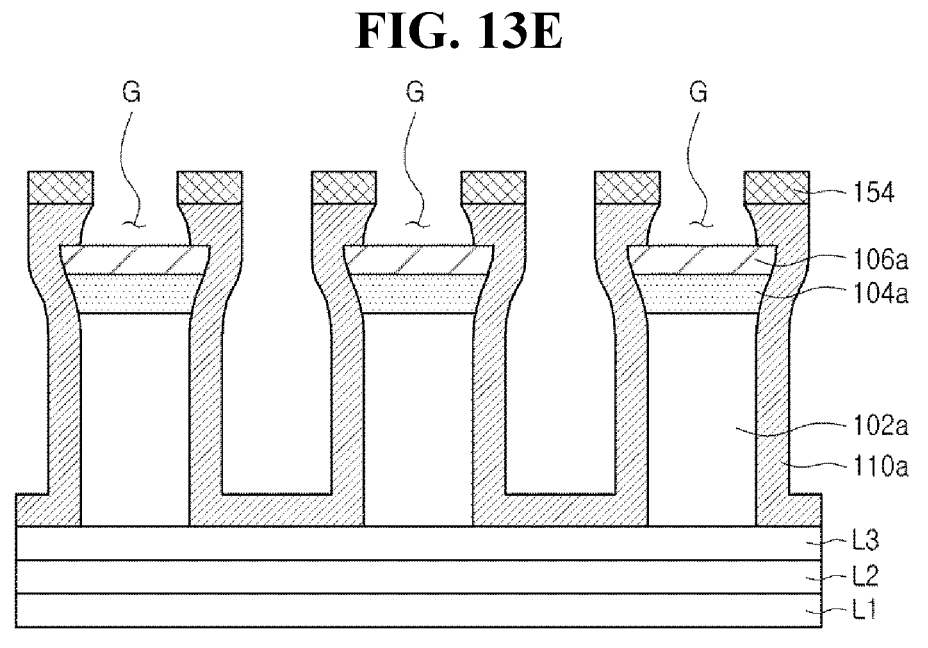

Referring to FIG. 13E, a portion of the upper surface of the passivation layer 110*a* may be etched using the second mask pattern 154. Accordingly, at least a portion of the upper surface of the second conductivity type semiconductor 106*a* may be exposed.

A space G may be formed by the etching process. The space G may be defined by a side surface of the passivation layer 110*a* and an upper surface of the second conductivity type semiconductor 106*a*. The space G may have a shape having a width increasing from the upper portion to the lower portion.

Thereafter, the second mask pattern 154 of FIG. 13E may be removed, and the electrode layer 108*a* may be formed in the space G. The electrode layer 108*a* may be formed to have the same shape as the space G. Thus, the same structure as that of FIG. 12E may be formed.

Thereafter, the separation layer L3 of FIG. 12E is removed. As illustrated in FIG. 12F, the semiconductor light emitting device 100*a* may be manufactured.

FIGS. 14A to 14D are cross-sectional views of stages in a method of manufacturing the semiconductor light emitting device 100*b* illustrated in FIG. 5 according to example embodiments. In the manufacturing method of FIGS. 14A to 14D, features described with the same reference numerals as those in FIGS. 11A to 13E may be the same or similar.

Figure 14A:
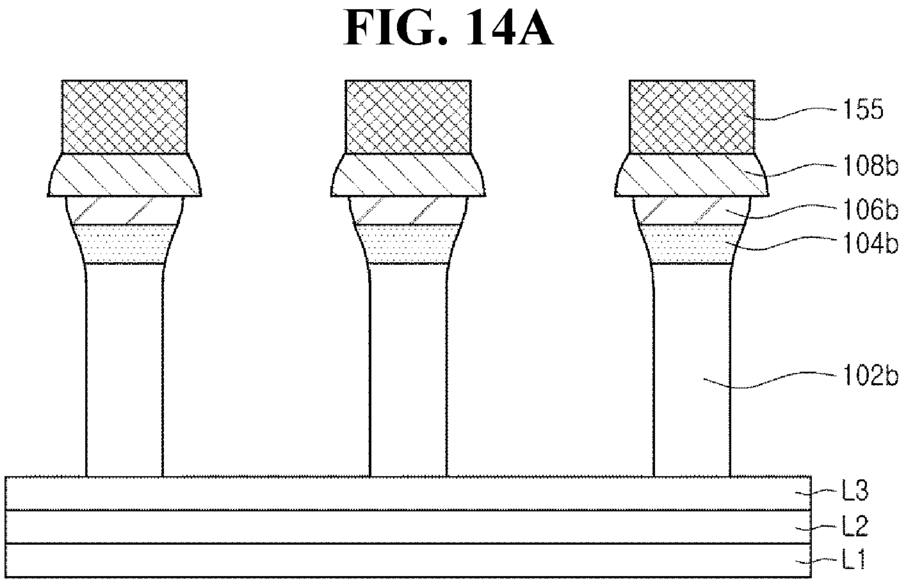

Referring to FIG. 14A, the buffer material layer L2, the separation layer L3, the first conductivity type semiconductor 102*b*, the active layer 104*b*, the second conductivity type semiconductor 106*b*, and the electrode layer 108*b* may be sequentially formed on the base substrate L1. Thereafter, a mask pattern 155 may be formed on the upper surface of the electrode layer 108*b*. The mask pattern 155 may include a plurality of patterns spaced apart from each other in the horizontal direction.

The semiconductor stack may be etched using the mask pattern 155. The first conductivity type semiconductor 102*b*, the active layer 104*b*, and the second conductivity type semiconductor 106*b* may be etched to have a width narrower than the width of the electrode layer 108*b* by wet etching. As illustrated in FIG. 14A, the electrode layer 108*b* may be formed to have a lower surface wider than the upper surface of the second conductivity type semiconductor 106*b*.

Figure 14B:
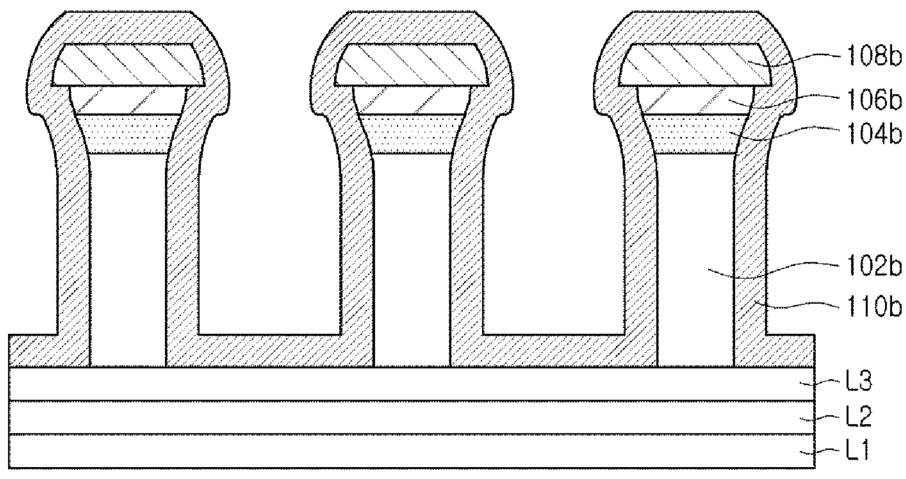

Referring to FIG. 14B, the passivation layer 110*b* may be formed to surround the first conductivity type semiconductor 102*b*, the active layer 104*b*, the second conductivity type semiconductor 106*b*, and the electrode layer 108*b*.

Since the electrode layer 108*b* is formed to have a lower surface wider than the upper surface of the second conductivity type semiconductor 106*b*, the passivation layer 110*b* may be formed to cover the lower surface of the electrode layer 108*b* not covered by the upper surface of the second conductivity type semiconductor 106*b*. The passivation layer 110*b* is deposited over the entire surface, and therefore, may also be deposited on the upper surface of the electrode layer 108*b* and the upper surface of the separation layer L3, in addition to the side surfaces of the first conductivity type semiconductor 102*b*, the active layer 104*b*, the second conductivity type semiconductor 106*b*, and the electrode layer 108*b*.

Figure 14C:
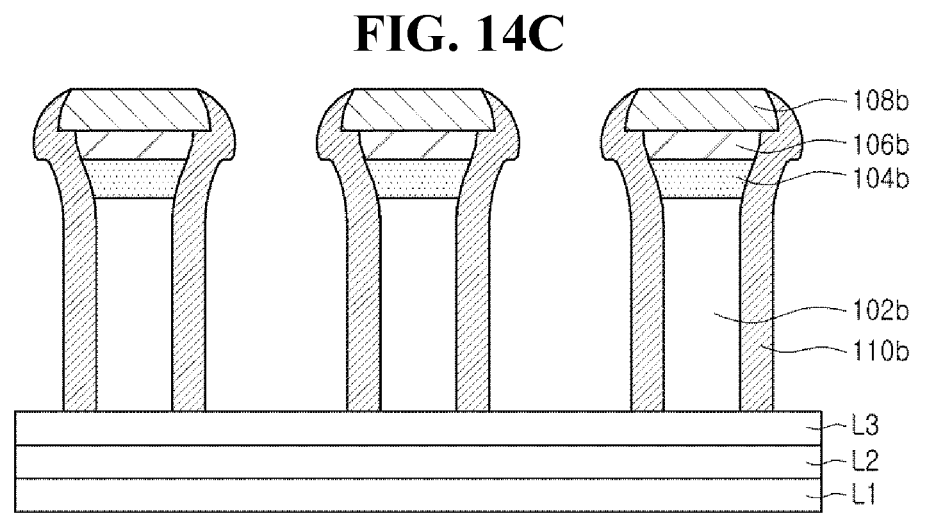

Referring to FIG. 14C, the passivation layer 110*b* formed in an unwanted region may be selectively removed to expose the upper surface of the electrode layer 108*b*.

The passivation layer 110*b* formed on the upper surface of the electrode layer 108*b* and the upper surface of the separation layer L3 may be etched. While the upper surface of the electrode layer 108*b* is exposed, the passivation layer 110*b* may be provided on the side surfaces of the electrode layer 108*b*, the second conductivity type semiconductor 106*b*, the active layer 104*b*, and the first conductivity type semiconductor 102*b*.

In the process of removing the passivation layer 110*b*, a portion of the passivation layer 110*b* formed on the side surface of the electrode layer 108*b* may be removed together. The passivation layer 110*b* may be etched to have rounded edges.

As illustrated in FIG. 14C, the electrode layer 108*b* vertically overlaps the second conductivity type semiconductor 106*b* and the active layer 104*b*, and may have an area wider than the second conductivity type semiconductor 106*b* and the active layer 104*b*. The second conductivity type semiconductor 106*b* and the active layer 104*b* may be protected by the passivation layer 110*b*. Accordingly, in the process of etching the passivation layer 110*b*, the side surfaces of the second conductivity type semiconductor 106*b* and the active layer 104*b* are not exposed, and defects, e.g., leakage current and short circuit of the semiconductor light emitting device, may be prevented or substantially minimized.

Figure 14D:
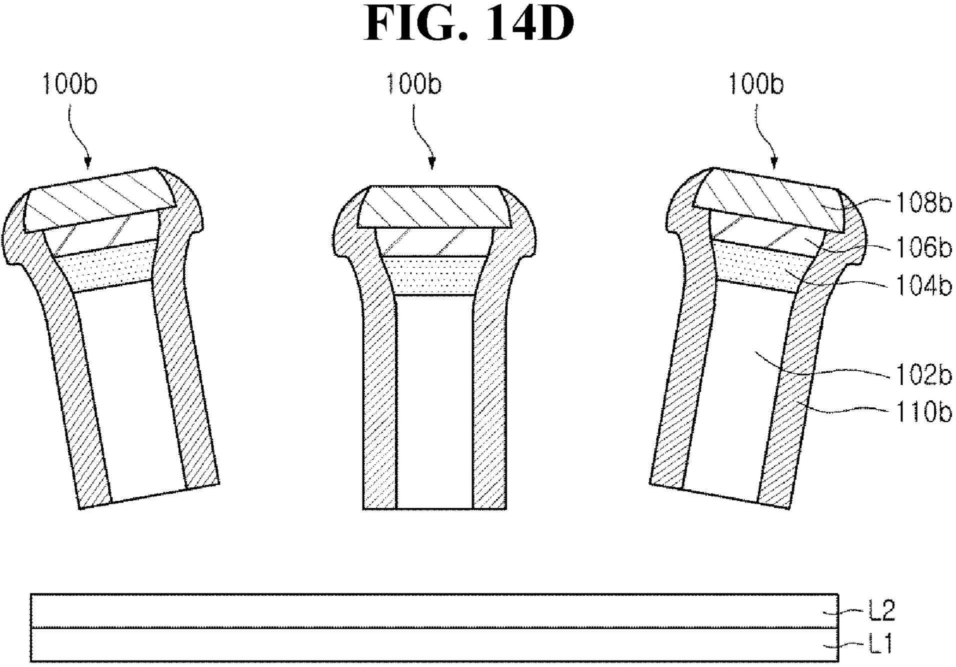

Referring to FIG. 14D, the separation layer L3 may be removed to separate the semiconductor light emitting device 100*b* from the base substrate L1. The separation layer L3 may be removed, e.g., by a chemical method. The semiconductor light emitting device 100*b* separated from the base substrate L1 may be the same as that in the example embodiment illustrated in FIG. 5.

By way of summation and review, example embodiments provide a semiconductor light emitting device in which a semiconductor layer and an active layer are protected by a passivation layer to prevent leakage currents and improve efficiency. That is, as set forth above, by protecting the side surfaces of the semiconductor layer and the electrode layer with the passivation layer, leakage current of the semiconductor light emitting device may be prevented and efficiency may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:

a first conductivity type semiconductor;

an active layer on the first conductivity type semiconductor;

a second conductivity type semiconductor on the active layer;

an electrode layer on the second conductivity type semiconductor; and a passivation layer covering a side surface of each of the first conductivity type semiconductor, the active layer, the second conductivity type semiconductor, and the electrode layer, wherein an angle between a lower surface and the side surface of the electrode layer is about 45° or more and about 90° or less, and wherein the passivation layer comprises:

a first portion on the side surface of the first conductivity type semiconductor, the first portion having a first thickness, and a second portion on the side surface of the electrode layer, the second portion having a second thickness different from the first thickness, and wherein the first conductivity type semiconductor has a thickness in a stacking direction of the first conductivity type semiconductor, the active layer, and the second conductivity type semiconductor that is greater than a width of the first conductivity type semiconductor.

2. The semiconductor light emitting device as claimed in claim 1, wherein the angle between the lower surface and the side surface of the electrode layer is about 70° or more and about 90° or less.

3. The semiconductor light emitting device as claimed in claim 1, wherein the first thickness is about 30 nm to about 100 nm.

4. The semiconductor light emitting device as claimed in claim 1, wherein at least a portion of the second portion of the passivation layer has a curved external side surface.

5. The semiconductor light emitting device as claimed in claim 1, wherein the side surface of the electrode layer is horizontally offset relative to the side surface of the second conductivity type semiconductor.

6. The semiconductor light emitting device as claimed in claim 1, wherein a perimeter of the lower surface of the electrode layer is spaced apart from a perimeter of an upper surface of the second conductivity type semiconductor inwardly.

7. The semiconductor light emitting device as claimed in claim 6, wherein the second thickness of the second portion of the passivation layer is greater than the first thickness of the first portion of the passivation layer.

8. The semiconductor light emitting device as claimed in claim 1, wherein a perimeter of the lower surface of the electrode layer is spaced apart from a perimeter of an upper surface of the second conductivity type semiconductor outwardly.

9. The semiconductor light emitting device as claimed in claim 1, wherein:

the first conductivity type semiconductor has a first width, the active layer has a second width greater than or equal to the first width, and the second conductivity type semiconductor has a third width greater than or equal to the second width.

10. The semiconductor light emitting device as claimed in claim 1, wherein the side surface of the first conductivity type semiconductor is aligned with the side surface of each of the active layer and the second conductivity type semiconductor.

11. The semiconductor light emitting device as claimed in claim 1, wherein the electrode layer overlaps the second conductivity type semiconductor in a vertical direction, and wherein the side surface of the electrode layer includes at least a portion that is not aligned with the side surface of the second conductivity type semiconductor.

12. The semiconductor light emitting device as claimed in claim 11, wherein the lower surface of the electrode layer has an area smaller than an area of an upper surface of the second conductivity type semiconductor.

13. The semiconductor light emitting device as claimed in claim 12, wherein the passivation layer covers the side surface of the second conductivity type semiconductor and at least a portion of an upper surface connected to the side surface of the second conductivity type semiconductor.

14. The semiconductor light emitting device as claimed in claim 11, wherein the lower surface of the electrode layer has an area larger than an area of an upper surface of the second conductivity type semiconductor.

15. The semiconductor light emitting device as claimed in claim 14, wherein the passivation layer covers the side surface of the electrode layer and at least a portion of the lower surface of the electrode layer connected to the side surface of the electrode layer.

16. The semiconductor light emitting device as claimed in claim 1, wherein a perimeter of the lower surface of the electrode layer is horizontally spaced apart from a perimeter of an upper surface of the second conductivity type semiconductor by a distance of about 30 nm to about 50 nm.

17. The semiconductor light emitting device as claimed in claim 16, wherein a maximum thickness of the passivation layer is about 30 nm or more and about 100 nm or less.

18. The semiconductor light emitting device as claimed in claim 16, wherein the semiconductor light emitting device has a substantially cylindrical structure.

19. The semiconductor light emitting device as claimed in claim 16, wherein a diameter of the semiconductor light emitting device is about 100 nm or more and about 1 μm or less.

20. A semiconductor light emitting device, comprising:

a first conductivity type semiconductor;

an active layer on the first conductivity type semiconductor;

a second conductivity type semiconductor on the active layer;

an electrode layer on the second conductivity type semiconductor; and a passivation layer covering a side surface of each of the first conductivity type semiconductor, the active layer, the second conductivity type semiconductor, and the electrode layer, wherein an angle between a lower surface and the side surface of the electrode layer is about 45° or more and about 90° or less, wherein the passivation layer comprises:

a first portion on the side surface of the first conductivity type semiconductor, the first portion having a first thickness, and a second portion on the side surface of the electrode layer, the second portion having a second thickness less than the first thickness.

* * * * *